United States Patent
Song et al.

(10) Patent No.: US 11,502,079 B2
(45) Date of Patent: Nov. 15, 2022

(54) INTEGRATED DEVICE COMPRISING A CMOS STRUCTURE COMPRISING WELL-LESS TRANSISTORS

(71) Applicant: QUALCOMM Incorporated, San Diego, CA (US)

(72) Inventors: Stanley Seungchul Song, San Diego, CA (US); Hyunwoo Park, San Diego, CA (US); Peijie Feng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 134 days.

(21) Appl. No.: 16/817,446

(22) Filed: Mar. 12, 2020

(65) Prior Publication Data

US 2021/0057410 A1 Feb. 25, 2021

Related U.S. Application Data

(60) Provisional application No. 62/890,012, filed on Aug. 21, 2019.

(51) Int. Cl.
*H01L 27/092* (2006.01)
*H01L 29/06* (2006.01)

(52) U.S. Cl.
CPC ...... *H01L 27/0922* (2013.01); *H01L 29/0653* (2013.01)

(58) Field of Classification Search
CPC ............ H01L 27/0922; H01L 29/0653; H01L 2224/13022; H01L 2924/00014;
(Continued)

(56) References Cited

U.S. PATENT DOCUMENTS 9,590,038 B1 3/2017 Kim et al.
9,991,352 B1 6/2018 Frougier et al.
(Continued)

FOREIGN PATENT DOCUMENTS

WO 2019132865 A1 7/2019

OTHER PUBLICATIONS

International Search Report and Written Opinion—PCT/US2020/040894—ISA/EPO—dated Oct. 20, 2020.

*Primary Examiner* — Karen Kusumakar
*Assistant Examiner* — Adam S Bowen
(74) *Attorney, Agent, or Firm* — Loza & Loza, LLP/Qualcomm

(57) ABSTRACT

An integrated device that includes a substrate, a first transistor, and a second transistor. The second transistor is configured to be coupled to the first transistor. The first transistor is configured to operate as a N-type channel metal oxide semiconductor transistor (NMOS) transistor. The first transistor includes a dielectric layer disposed over the substrate; a first source disposed over the dielectric layer; a first drain disposed over the dielectric layer; a first plurality of channels coupled to the first source and the first drain; and a first gate surrounding the plurality of channels. The second transistor is configured to operate as a P-type channel metal oxide semiconductor transistor (PMOS). The second transistor includes the dielectric layer; a second source disposed over the dielectric layer; a second drain disposed over the dielectric layer; a second plurality of channels coupled to the second source and the second drain; and a second gate.

26 Claims, 19 Drawing Sheets

(58) Field of Classification Search
CPC ....... H01L 2224/0401; H01L 2224/131; H01L 21/823807; H01L 27/0921; H01L 27/092; H01L 29/0673; H01L 29/0847; H01L 29/42392; H01L 29/66439; H01L 29/66545; H01L 29/775; H01L 29/78696; B82Y 10/00

See application file for complete search history.

(56) References Cited

U.S. PATENT DOCUMENTS

| | | | |
|---|---|---|---|
| 10,263,100 B1* | 4/2019 | Bi | H01L 29/78654 |
| 10,700,064 B1* | 6/2020 | Zhang | H01L 29/4966 |
| 2019/0181224 A1 | 6/2019 | Zhang et al. | |
| 2020/0035676 A1* | 1/2020 | Wang | H01L 29/66772 |
| 2021/0183857 A1* | 6/2021 | Hafez | H01L 29/78696 |
| 2021/0280683 A1* | 9/2021 | Trivedi | H01L 29/66795 |

* cited by examiner

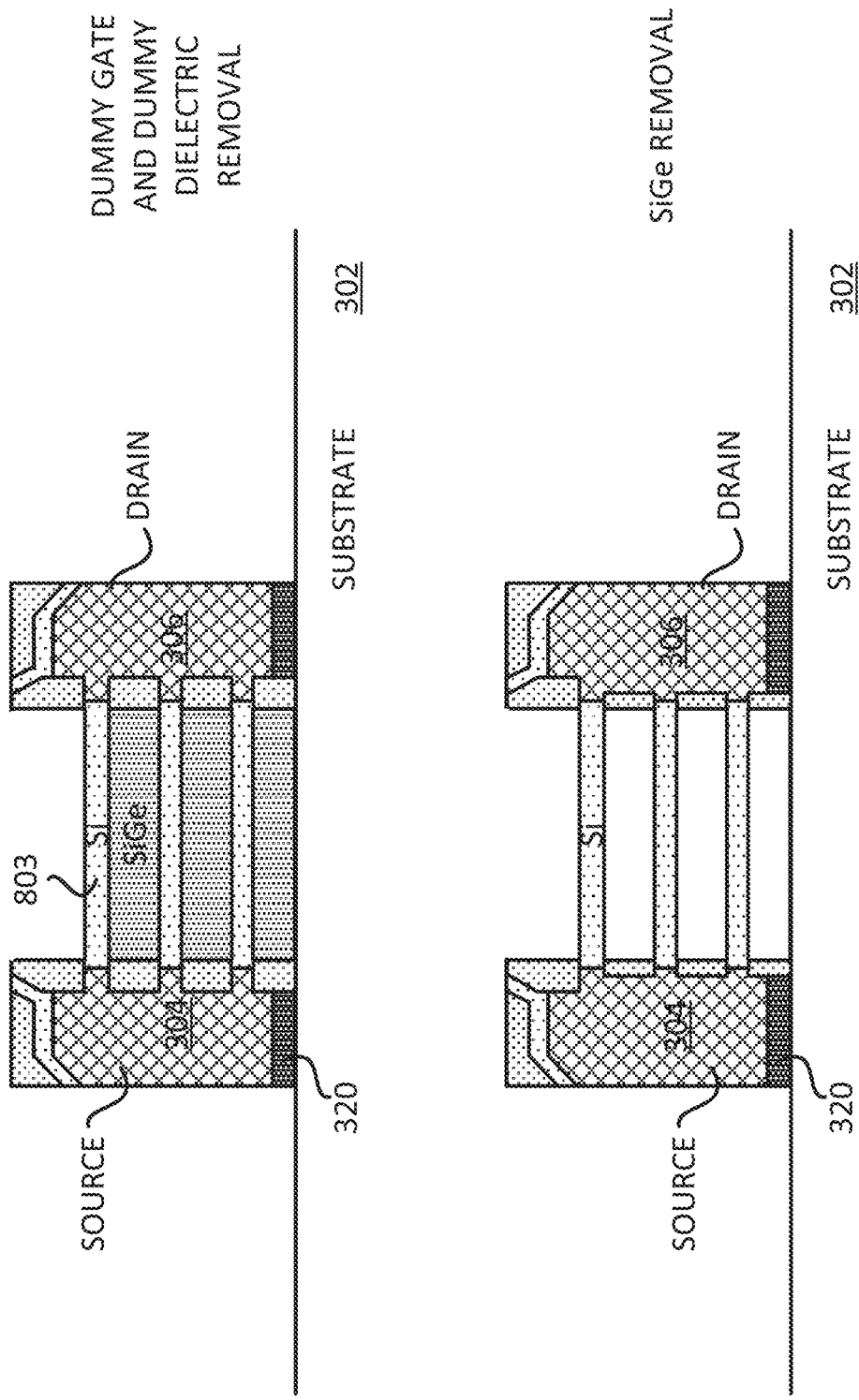

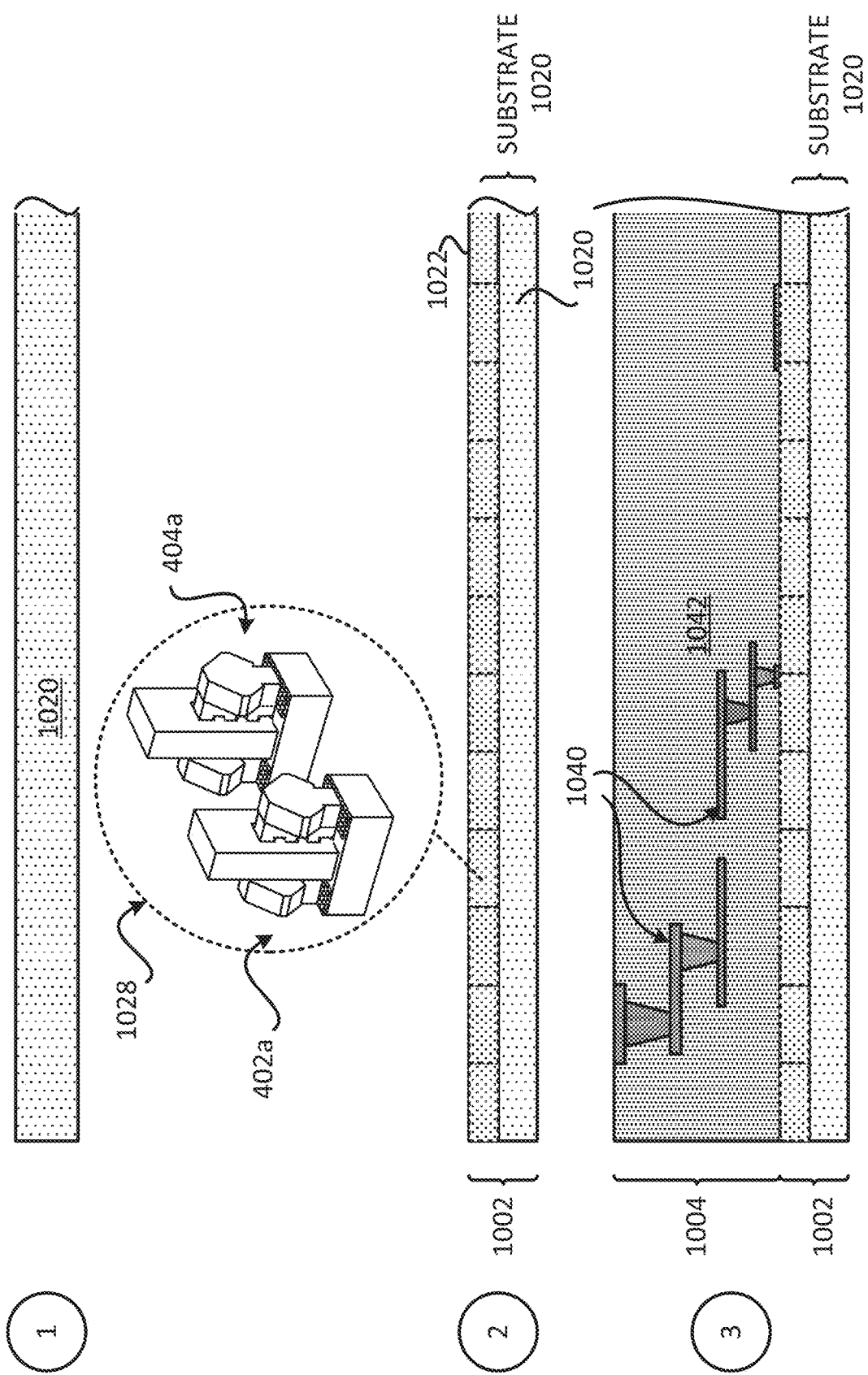

INTEGRATED DEVICE COMPRISING A CMOS STRUCTURE COMPRISING WELL-LESS TRANSISTORS

CROSS-REFERENCE/CLAIM OF PRIORITY TO RELATED APPLICATION

The present application claims priority to and the benefit of U.S. Provisional Application No. 62/890,012, filed on Aug. 21, 2019, and titled, "INTEGRATED DEVICE COMPRISING A CMOS STRUCTURE COMPRISING WELL-LESS TRANSISTORS", which is hereby expressly incorporated by reference.

FIELD

Various features relate to integrated devices, but more specifically to integrated devices comprising a CMOS structure comprising well-less transistors.

BACKGROUND

FIG. 1 illustrates a complementary metal-oxide-semiconductor (CMOS) structure 100 that includes a P-type channel metal oxide semiconductor (PMOS) transistor 120 and a N-type channel metal oxide semiconductor (NMOS) transistor 140. The PMOS transistor 120 is formed over a N well 102, while the NMOS transistor 140 is formed over a P well 104. Both the N well 102 and the P well 104 are each formed in a substrate 105. As shown in FIG. 1, the PMOS transistor 120 and the NMOS transistor 140 are located adjacent to each other, in a twin well arrangement. The PMOS transistor 120 and the NMOS transistor 140 are separated by a spacing (S). The spacing (S) may represent the spacing between the N well 102 and the P well 104. An integrated device, such as an integrated circuit (IC) may include a plurality of CMOS structures 100 that each includes a PMOS transistor 120 and a NMOS transistor 140. There is an ongoing need to reduce the size and space that a CMOS structure takes up in an integrated device.

SUMMARY

Various features relate to integrated devices, but more specifically to integrated devices comprising a CMOS structure comprising well-less transistors.

One example provides an integrated device that includes a substrate and a first transistor formed over the substrate. The first transistor includes a dielectric layer disposed over the substrate, a first source disposed over the dielectric layer, a first drain disposed over the dielectric layer, a first plurality of channels coupled to the first source and the first drain, where the first plurality of channels is located between the first source and the first drain, and a first gate surrounding the first plurality of channels.

Another example provides an apparatus that includes a substrate and first transistor means formed over the substrate. The first transistor means includes a dielectric layer disposed over the substrate, first source means disposed over the dielectric layer, first drain means disposed over the dielectric layer, first means for channeling coupled to the first source means and the first drain means, where the first means for channeling is located between the first source means and the first drain means, and first gate means surrounding the first means for channeling.

Another example provides a method for fabricating an integrated device. The method provides a substrate. The method forms a first transistor over the substrate. Forming the first transistor includes forming a first plurality of channels over the substrate; forming a dielectric layer over the substrate; forming a first source over the dielectric layer; forming a first drain over the dielectric layer; and forming a first gate around the first plurality of channels. The first plurality of channels is coupled to the first source and the first drain. The first plurality of channels is located between the first source and the first drain.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

As mentioned above, there is an ongoing need scale complementary metal-oxide-semiconductor (CMOS) structures so that the CMOS structures are smaller and take up less real estate. However, scaling a CMOS structure that includes a PMOS transistor and a NMOS transistor, to smaller sizes has limitations due to well isolation issues and latch-up that may occur with PMOS transistors and NMOS transistors at smaller scales.

Figure 1:
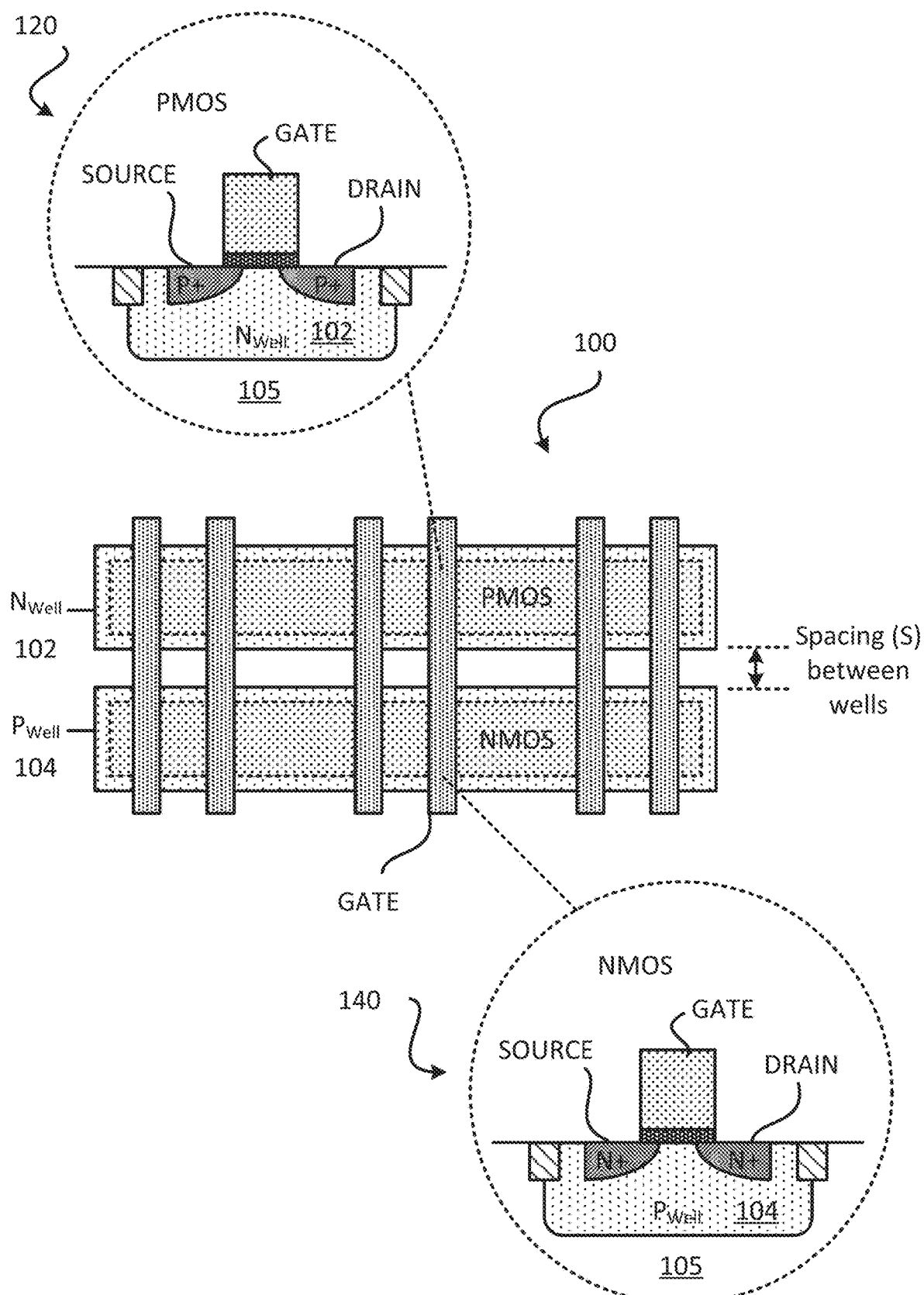
FIG. 1 illustrates a view of a complementary metal-oxide-semiconductor (CMOS) structure that includes a P-type channel metal oxide semiconductor (PMOS) transistor and a N-type channel metal oxide semiconductor (NMOS) transistor.
Figure 2:
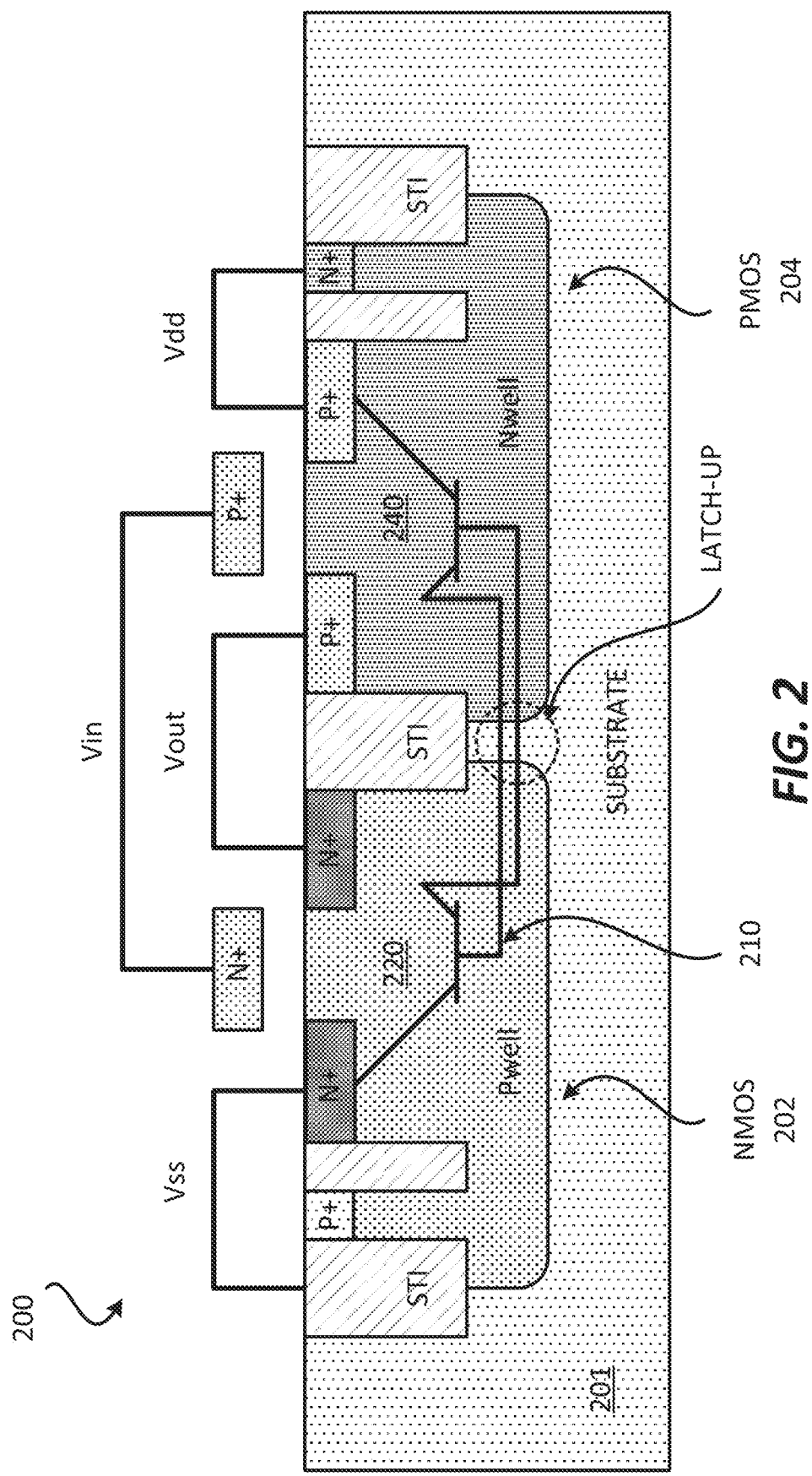
FIG. 2 illustrates a circuit diagram overlaid over the CMOS structure that includes a PMOS transistor and a NMOS transistor.

FIG. 2 illustrates an exemplary view of a CMOS structure 200 that includes a NMOS transistor 202 located next to a PMOS transistor 204. A circuit diagram 210 is overlaid over the CMOS structure 200. The NMOS transistor 202 is formed over the P well 220, and the PMOS transistor 204 is formed over the N well 240. Both the P well 220 and the N well 240 are formed in the substrate 201. In some instances, as the spacing between the P well 220 and the N well 240 decreases, a latch up between the NMOS transistor 202 and the PMOS transistor 204 may occur. In particular, a latch up may occur between the power (e.g., Vdd) of PMOS transistor 204 and the ground (e.g., Vss) of the NMOS transistor 202. This may be the case when there is not enough isolation between the P well 220 and the N well 240 in the substrate 201.

A latch-up is a type of short circuit that can occur in a CMOS structure of an integrated device. A latch-up may occur when an unintended low-impedance path between power and ground is created. During latch-up, when one of the transistors (e.g., NMOS transistor) is conducting, the other transistor (e.g., PMOS transistor) may begin to conduct as well. In some instances, as long as there some current that flows though the transistors, both transistors may keep each other in saturation. As PMOS transistors and NMOS transistors in a CMOS structure are formed closer to each other, the likelihood of latch-up increases. Thus, to provide any sort of CMOS structure that includes a PMOS transistor and a NMOS transistor, at smaller scales, the issue of latch up of the CMOS structure must be addressed.

The present disclosure describes an integrated device that may include a complementary metal-oxide-semiconductor (CMOS) structure. The CMOS structure may include a substrate, a first transistor formed over the substrate, and a second transistor formed over the substrate. The second transistor may be configured to be electrically coupled to the first transistor. The first transistor may be configured to operate as a N-type channel metal oxide semiconductor (NMOS) transistor. The first transistor includes a dielectric layer disposed over the substrate; a first source disposed over the dielectric layer; a first drain disposed over the dielectric layer; a first plurality of channels coupled to the first source and the first drain, the first plurality of channels located between the first source and the first drain; and a first gate surrounding the plurality of channels. The second transistor may be configured to operate as a P-type channel metal oxide semiconductor (PMOS) transistor. The second transistor includes the dielectric layer disposed over the substrate; a second source disposed over the dielectric layer; a second drain disposed over the dielectric layer; a second plurality of channels coupled to the second source and the second drain, the second plurality of channels located between the second source and the second drain; and a second gate surrounding the second plurality of channels. The second gate and the first gate may be part of the same gate. In some implementations, the first transistor and the second transistor are each free of a well (e.g., well-less). One of the technical advantages of the CMOS structure described in the disclosure, is the ability to scale (e.g., reduce) the CMOS structure much more aggressively without latch-up being an issue.

Exemplary Well-Less Gate-All-Around Field Effect Transistor (FET)

Figure 3:
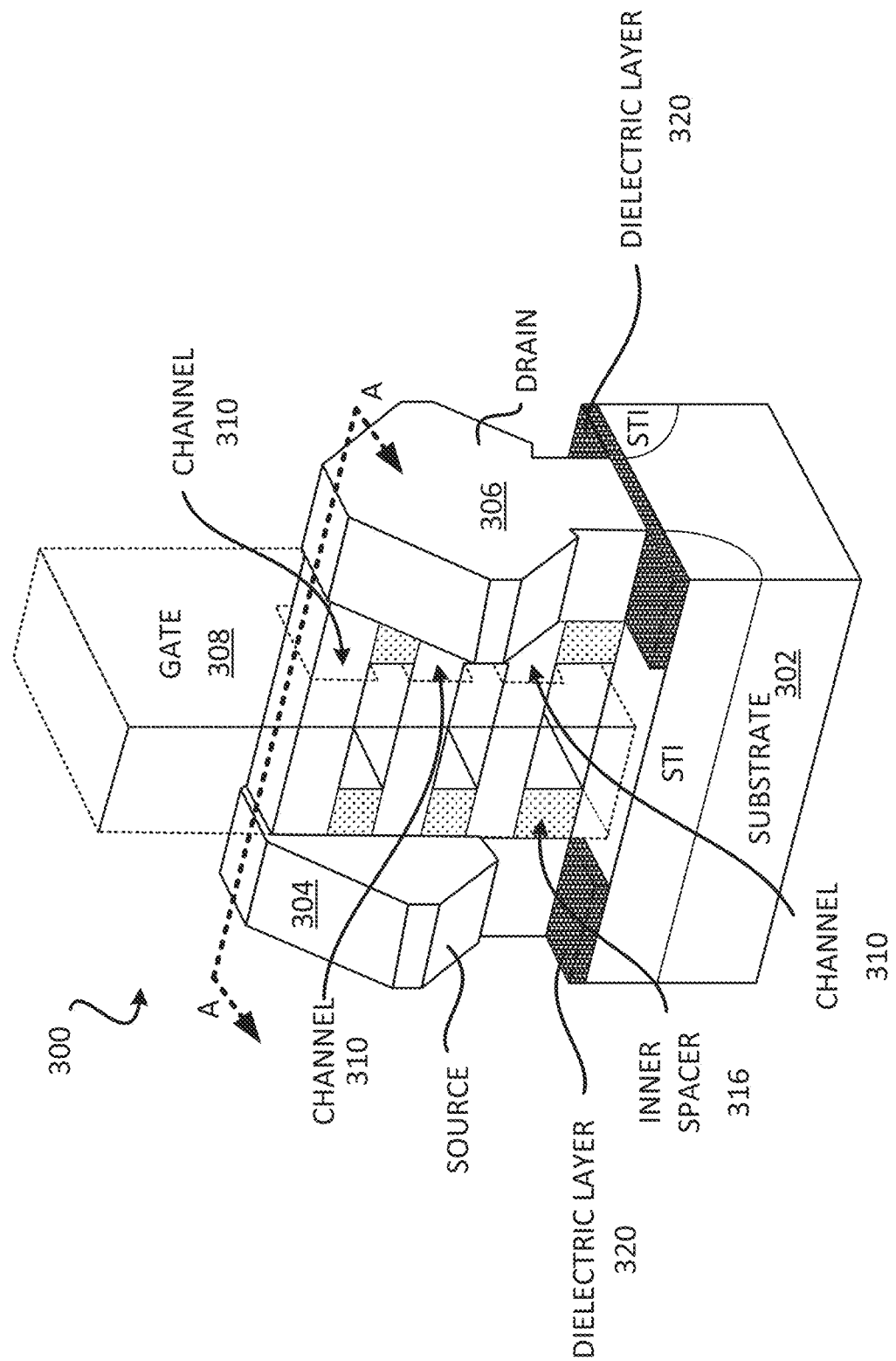
FIG. 3 illustrates an exemplary view of a gate-all-around field effect transistor (FET) formed over a substrate.

FIG. 3 illustrates an example of a transistor 300 that is formed over a substrate. The transistor 300 may be a gate-all-around (GAA) field effect transistor (FET). In particular, the transistor 300 may be a well-less multi-channel gate-all-around FET. The transistor 300 may be configured as (i) a N-type channel metal oxide semiconductor (NMOS) transistor, or (ii) a P-type channel metal oxide semiconductor (PMOS) transistor. As will be further described below, a complementary metal-oxide-semiconductor (CMOS) structure may be defined by a first transistor (e.g., 300) configured as a NMOS transistor and a second transistor (e.g., 300) configured as a PMOS transistor. The transistor 300 may be a transistor means. The transistor 300 may be implemented in an integrated device.

As shown in FIG. 3, the transistor 300 is formed over the substrate 302. The transistor 300 includes a source 304, a drain 306, a gate 308, a plurality of channels 310, inner spacers 316, and a dielectric layer 320. The source 304 may be a source means. The drain 306 may be a drain means. The gate 308 may be a gate means. The plurality of channels 310 may be a means for channeling. In some implementations, the substrate 302 may be considered part of the transistor 300. FIG. 3 also illustrates that the transistor 300 is free of a well (e.g., N well, P well). Instead of wells, the dielectric layer 320 provides the isolation of the source 304 and the drain 306 from the substrate 302. Thus, the presence of the dielectric layer 320 with the transistor 300 may eliminate the need of one or more wells (e.g., N well, P well) for the transistor 300.

FIG. 3 illustrates the dielectric layer 320 (e.g., isolation dielectric layer) disposed (e.g., formed) over the substrate 302. The source 304 is disposed (e.g., formed) over the dielectric layer 320. Similarly, the drain 306 is disposed (e.g., formed) over the dielectric layer 320. The plurality of channels 310 is coupled to the source 304 and the drain 306. The plurality of channels 310 is located between the source 304 and the drain 306. The plurality of channels 310 is configured to allow a current to flow between the source 304 and the drain 306 when a voltage (e.g., threshold voltage) is applied between the gate 308 and the substrate 302. The plurality of channels 310 may include a first channel, a second channel and a third channel. The first channel, the second channel and the third channel may be stacked vertically above one another, with a space (for a gate) between each channel. Different implementations may include a different number of channels. The gate 308 is located between the source 304 and the drain 306. The gate 308 is formed such as to wrap around or surround the plurality of channels 310. For example, the gate 308 may surround the four sides of a channel from the plurality of channels 310. It is noted that the size and shape of the transistor 300 is exemplary. Moreover, the components of the transistor 300 shown may not be to scale.

As mentioned above, the transistor 300 may be configured to operate as a NMOS transistor or a PMOS transistor. To operate as a NMOS transistor, the source 304 and the drain 306 may each include a N type dopant (N+). To operate as a PMOS transistor, the source 304 and the drain 306 may each include P type dopant (P+). Examples of how the transistor 300 may be configured to operate as a NMOS transistor or a PMOS transistor are further described below in at least FIGS. 5-6. As will be further described below, a first transistor configured to operate as a NMOS transistor and a second transistor configured to operate as a PMOS transistor, may be use to form and define a CMOS structure in an integrated device. The substrate 302 may include one or more shallow trench isolation (STI). In some implementations, the dielectric layer 320 may be located over the substrate 302 and/or one or more STIs.

Figure 4:
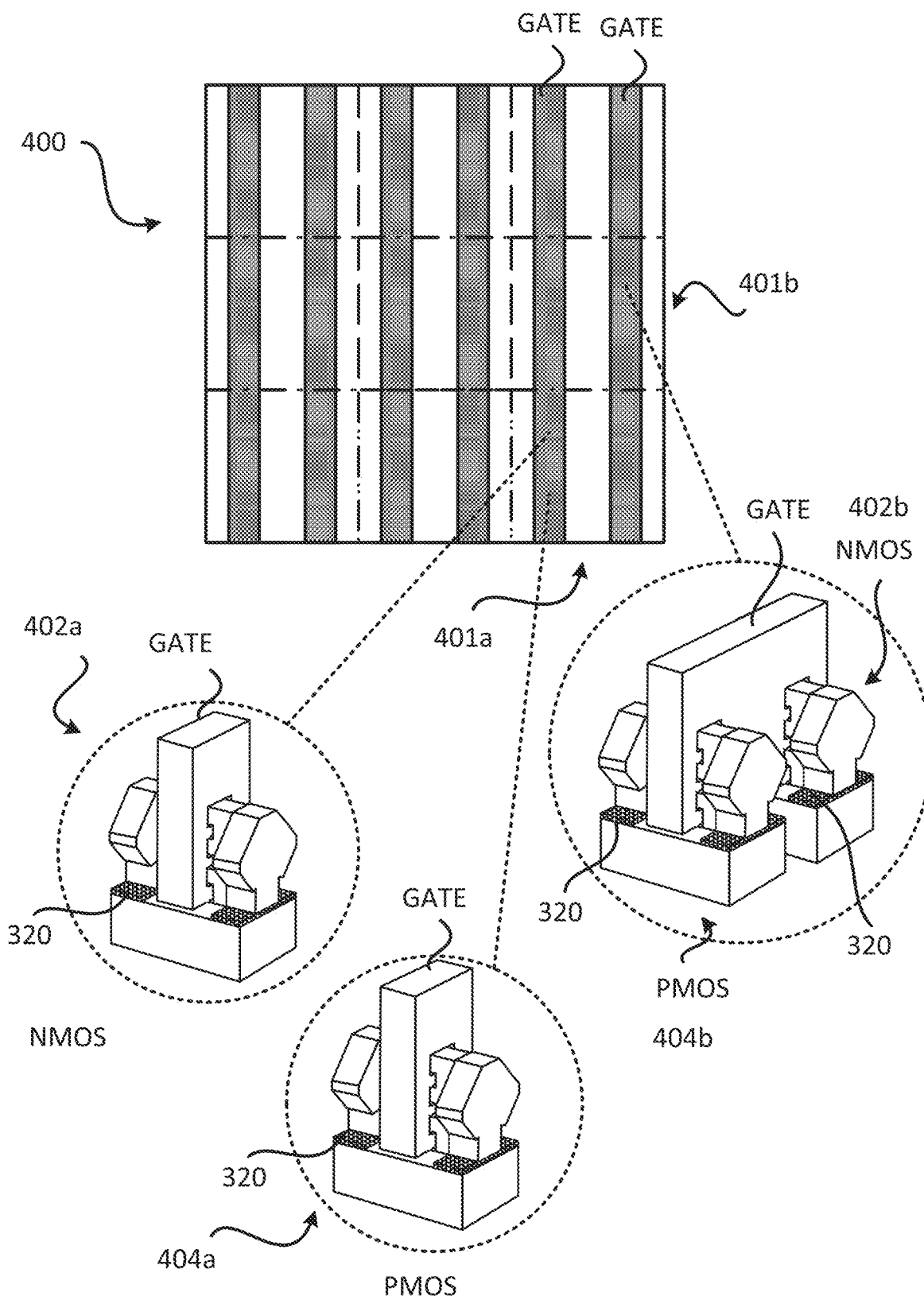
FIG. 4 illustrates a cell of an integrated device that includes gate-all-around FETs.

FIG. 4 illustrates a cell 400 of an integrated device. The cell 400 may represent a device level cell of an integrated device. As shown in FIG. 4, the cell 400 includes a CMOS structure 401a that is defined by a NMOS transistor 402a (e.g., first transistor) and a PMOS transistor 404a (e.g., second transistor). The NMOS transistor 402a may be the transistor 300, where the source and the drain include N type dopant (N+). Similarly, the PMOS transistor 404a may be the transistor 300, where the source and the drain include P type dopant (P+). The NMOS transistor 402a and the PMOS transistor 404a may have separate gates. In some implementations, a NMOS transistor and a PMOS transistor may share a gate. FIG. 4 illustrates a CMOS structure 401b that is defined by a NMOS transistor 402b (e.g., first transistor) and a PMOS transistor 404b (e.g., second transistor). The NMOS transistor 402b may be the transistor 300, where the source and the drain include N type dopant (N+). Similarly, the PMOS transistor 404b may be the transistor 300, where the source and the drain include P type dopant (P+). The NMOS transistor 402b and the PMOS transistor 404b share a gate. For example, the gate of the NMOS transistor 402b and the gate for the PMOS transistor 404b may be part of the same gate. More detailed examples of NMOS transistors and PMOS transistors are further described below in FIGS. 5-6. As will be further described below, an integrated device may include a plurality of cells 400, each cell having a same or different arrangement of CMOS structures, NMOS transistors, and/or PMOS transistors.

Figure 6:
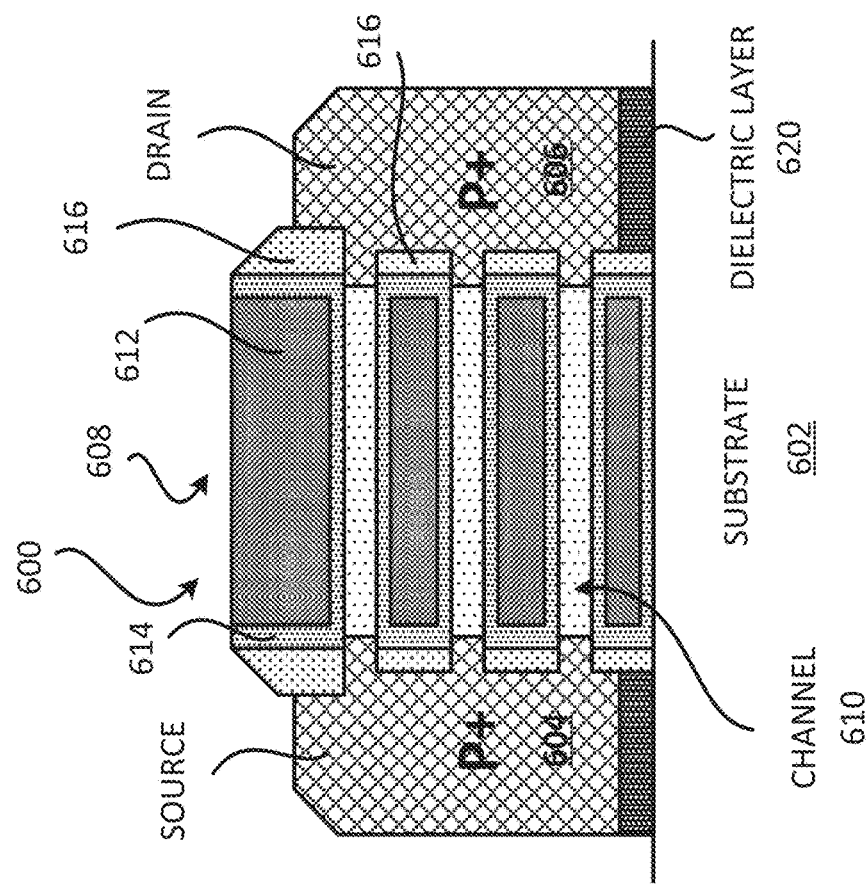
FIG. 6 illustrates an exemplary view of a gate-all-around FET configured as a PMOS transistor.
Figure 5:
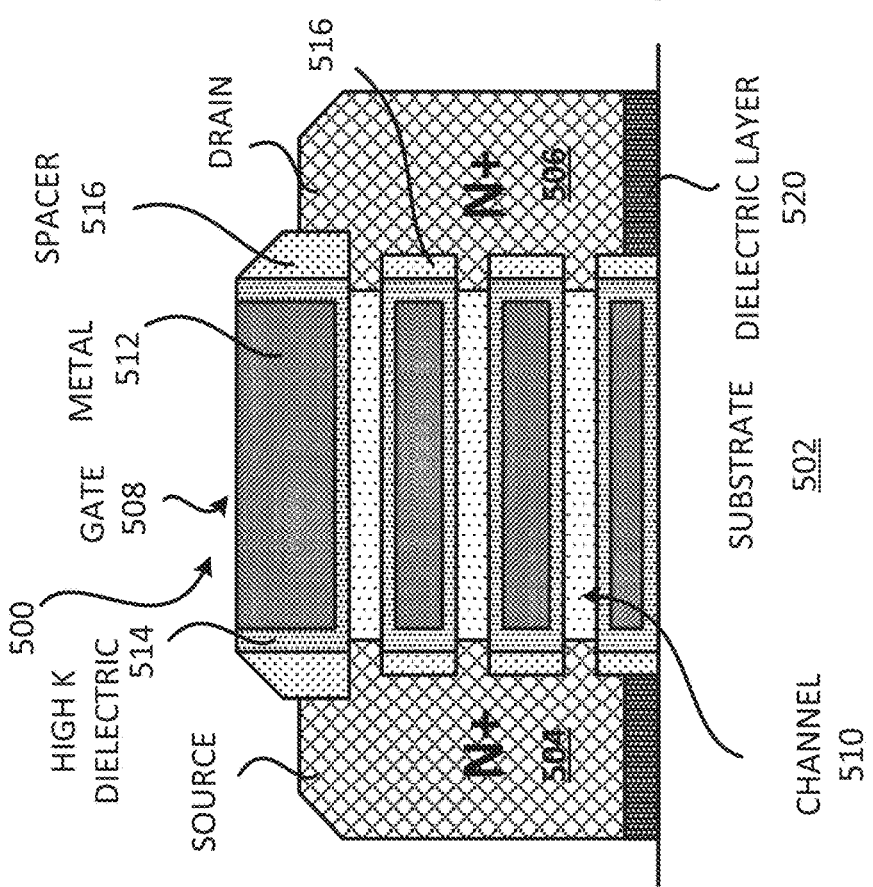
FIG. 5 illustrates an exemplary view of a gate-all-around FET configured as a NMOS transistor.

FIGS. 5 and 6 respectively illustrate profile views of a NMOS transistor and a PMOS transistor. The profile views of the NMOS transistor and the PMOS transistor may be across cross section AA of the transistor 300 of FIG. 3.

FIG. 5 illustrates an exemplary view of a first transistor 500 that is configured to operate as a NMOS transistor. The first transistor 500 may be a first transistor means. The first transistor 500 may be a more specific implementation of the transistor 300 of FIG. 3. The first transistor 500 is formed over the substrate 502. The transistor 500 includes a first source 504, a first drain 506, a first gate 508, a first plurality of channels 510, and a dielectric layer 520. The first source 504 may be a first source means. The first drain 506 may be a first drain means. The first gate 508 may be a first gate means. The first plurality of channels 510 may be a first means for channeling. In some implementations, the substrate 502 may be considered part of the first transistor 500. FIG. 5 also illustrates that the first transistor 500 is free of a well (e.g., N well, P well). Instead of wells, the dielectric layer 520 provides the isolation of the first source 504 and the first drain 506 from the substrate 502. Thus, the presence of the dielectric layer 520 with the first transistor 500 may eliminate the need of one or more wells (e.g., N well, P well) for the first transistor 500. Different implementations may include different materials for the dielectric layer 520. For example, the dielectric layer 520 may include SiO, SiN, SiC, SiON, and/or combinations thereof.

FIG. 5 illustrates the dielectric layer 520 (e.g., isolation dielectric layer) disposed (e.g., formed) over the substrate 502. The first source 504 is disposed (e.g., formed) over the dielectric layer 520. Similarly, the first drain 506 is disposed (e.g., formed) over the dielectric layer 520. The first source 504 and the first drain 506 each includes a N type dopant (N+). The dielectric layer 520 may be similar to the dielectric layer 320.

The first plurality of channels 510 is coupled to the first source 504 and the first drain 506. A metal component 512 and a high K dielectric layer 514 may be located over and/or around the first plurality of channels 510. A spacer 516 may be located between the gate 508 and the first source 504. A spacer 516 may be located between the gate 508 and the first drain 506. The metal component 512 may be considered part of the gate 508. The metal component 512 may include TiN, TaN, TiAl(C), W, and/or combinations thereof. The high K dielectric layer 514 may include HfO, HfSiO, HfSiON, HfLaO, HfLaSiO, HfLaSiON, HfAlO, HfAlSiO, HfAlSiON, and/or combinations thereof. The spacer 516 may include an outer spacer and/or an inner spacer (e.g., 316, 830). The spacer 516 may include SiO, SiN, SiON, SiC, and/or combinations thereof. However, different implementations may use different materials for the metal component 512, the high K dielectric layer 514 and/or the spacer 516. The first gate 508 may include the metal component 512. The first gate 508 may include the metal component 512 and the high K dielectric layer 514.

The first plurality of channels 510 is located between the first source 504 and the first drain 506. The first plurality of channels 510 is configured to allow a current to flow between the first source 504 and the first drain 506 when a voltage is applied between the first gate 508 and the substrate 502. The first plurality of channels 510 may include a first channel, a second channel and a third channel. The first channel, the second channel and the third channel may be stacked vertically above one another, with a space (for a gate) between each channel. Different implementations may include a different number of channels. The first gate 508 is located between the first source 504 and the first drain 506. The first gate 508 is formed such as to wrap around or surround the first plurality of channels 510. For example, the first gate 508 may surround the four sides of a channel from the first plurality of channels 510.

In some implementations, the dielectric layer 520 has a dielectric thickness in a range of approximately 7-20 nanometers (nm). In some implementations, each channel from the first plurality of channels 510 has a channel thickness of approximately 5-10 nanometers (nm). In some implementations, the vertical space or gap between a channel is approximately 7-20 nanometers (nm).

FIG. 6 illustrates an exemplary view of a second transistor 600 that is configured to operate as a PMOS transistor. The second transistor 600 may be a second transistor means. The second transistor 600 may be a more specific implementation of the transistor 300 of FIG. 3. The second transistor 600 may be similar to the first transistor 500. However, some components of the second transistor 600 may be doped differently. The second transistor 600 is formed over the substrate 602. The second transistor 600 includes a second source 604, a second drain 606, a second gate 608, a second plurality of channels 610, and a dielectric layer 620. The second source 604 may be second source means. The second drain 606 may be second drain means. The second gate 608 may be second gate means. The second plurality of channels 610 may be second means for channeling. In some implementations, the substrate 602 may be considered part of the second transistor 600. FIG. 6 also illustrates that the second transistor 600 is free of a well (e.g., N well, P well). Instead of wells, the dielectric layer 620 provides the isolation of the second source 604 and the second drain 606 from the substrate 602. Thus, the presence of the dielectric layer 620 with the second transistor 600 may eliminate the need of one or more wells (e.g., N well, P well) for the second transistor 600. Different implementations may include different materials for the dielectric layer 620. For example, the dielectric layer 620 may include SiO, SiN, SiC, SiON, and/or combinations thereof.

FIG. 6 illustrates the dielectric layer 620 (e.g., isolation dielectric layer) disposed (e.g., formed) over the substrate 602. The second source 604 is disposed (e.g., formed) over the dielectric layer 620. Similarly, the second drain 606 is disposed (e.g., formed) over the dielectric layer 620. The second source 604 and the second drain 606 each includes a P type dopant (P+). The dielectric layer 620 may be similar to the dielectric layer 320.

The second plurality of channels 610 is coupled to the second source 604 and the second drain 606. A metal component 612 and a high K dielectric layer 614 may be located over and/or around the second plurality of channels 610. A spacer 616 may be located between the gate 608 and the first source 604. A spacer 616 may be located between the gate 608 and the first drain 606. The metal component 612 may be considered part of the gate 608. The metal component 612 may include TiN, TaN, TiAl(C), W, and/or combinations thereof. The high K dielectric layer 614 may include HfO, HfSiO, HfSiON, HfLaO, HfLaSiO, HfLaSiON, HfAlO, HfAlSiO, HfAlSiON, and/or combinations thereof. The spacer 616 may include an outer spacer and/or an inner spacer (e.g., 316, 830). The spacer 616 may include SiO, SiN, SiON, SiC, and/or combinations thereof. However, different implementations may use different materials for the metal component 612, the high K dielectric layer 614 and/or the spacer 616. The second gate 608 may include the metal component 612. The second gate 608 may include the metal component 612 and the high K dielectric layer 614.

The second plurality of channels 610 is located between the second source 604 and the second drain 606. The second plurality of channels 610 is configured to allow a current to flow between the second source 604 and the second drain 606 when a voltage (e.g., threshold voltage) is applied between the second gate 608 and the substrate 602. The second plurality of channels 610 may include a second channel, a second channel and a third channel. The second channel, the second channel and the third channel may be stacked vertically above one another, with a space (for a gate) between each channel. Different implementations may include a different number of channels. The second gate 608 is located between the second source 604 and the second drain 606. The second gate 608 is formed such as to wrap around or surround the second plurality of channels 610. For example, the second gate 608 may surround the four sides of a channel from the second plurality of channels 610.

In some implementations, the dielectric layer 620 has a dielectric thickness in a range of approximately 7-20 nanometers (nm). In some implementations, each channel from the second plurality of channels 610 has a channel thickness of approximately 5-10 nanometers (nm). In some implementations, the vertical space or gap between a channel is approximately 7-20 nanometers (nm).

The first transistor 500 and the second transistor 600 may be used in combination to form and define a CMOS structure. In some implementations, the spacing between a NMOS transistor and a PMOS transistor may be approximately 30-200 nanometers (nm). For example, the spacing between the drain or source of a NMOS transistor and an adjacent drain or adjacent source of a PMOS transistor may be approximately 30-200 nanometers (nm). The spacing between a NMOS transistor and a PMOS transistor that share a same gate, may be approximately 30-200 nanometers (nm). The size of the transistors, the types of materials use may be selected to produce one or more transistors that require the lowest possible threshold voltage to active (e.g., turn on) the transistors.

In a field effect transistor (FET), a current may flow from a drain to a source through channels that are coupled to the drain and the source. When a voltage is applied between a gate and a substrate, an electrical field is produced that can control the current that flows between the drain and the source. A minimum voltage (or minimum threshold voltage) is required to be applied between the gate and the substrate in order to turn the transistor "on" and induce a current flow through the channel(s). If the minimum voltage (or minimum threshold voltage) is not met nor applied between the gate and the substrate, then the transistor may be "off" and no current flows through the channel(s). The minimum voltage (or minimum threshold voltage) that is required to turn the transistor "on" is typically a function or defined by the work function of transistor channel(s) and the gate. In order to have the lowest possible minimum threshold voltage, the work function difference between the channel and the gate should be as small as possible.

It is noted that the sizes and shapes of the NMOS transistor 500 and the PMOS transistor 600 are exemplary. Moreover, the components of the NMOS transistor 500 and/or the PMOS transistor 600 shown may not be to scale. In addition, the NMOS transistor 500 and/or the PMOS transistor 600 may include other components. In some implementations, at least some portions of the NMOS transistor 500 and/or at least some portions of the PMOS transistor 600 may be located over a substrate and/or one or more STIs.

Figure 7:
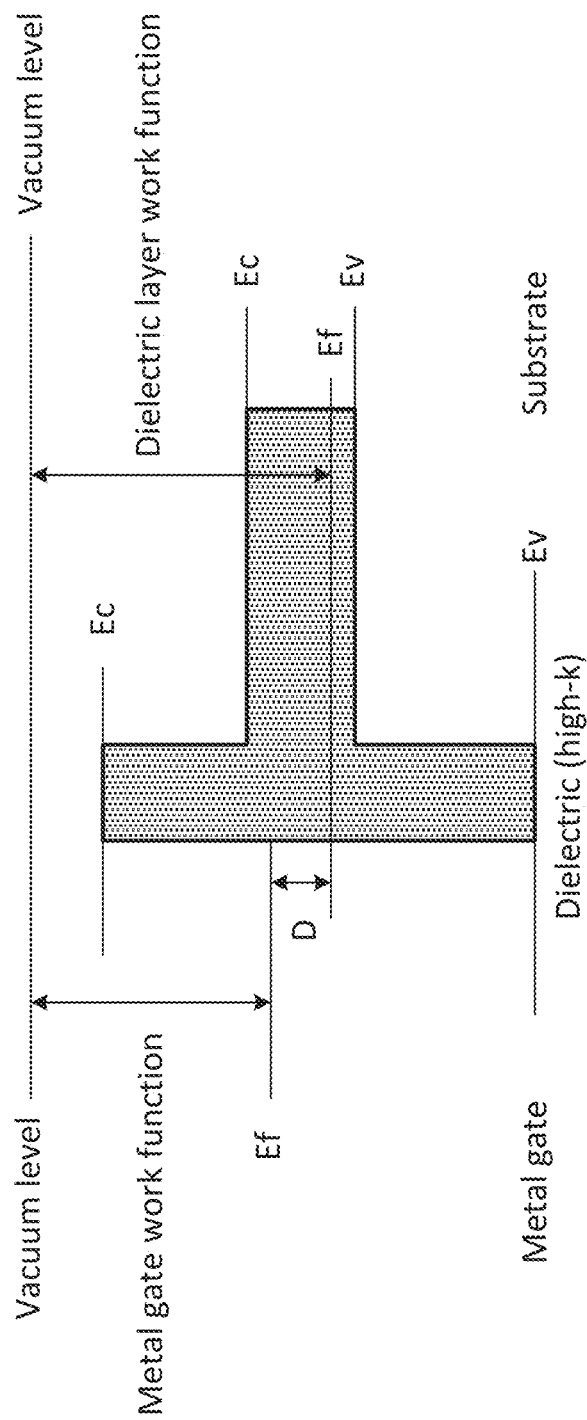
FIG. 7 illustrates an exemplary energy diagram for a FET.

FIG. 7 illustrates an energy diagram for a field effect transistor (FET). FIG. 7 illustrates the work function for the gate and the work function for the well. In addition, the energy diagram illustrates the various conduction bands, valence bands and Fermi energy levels for various components (e.g., substrate, gate) of the FET. The $E_C$ is the conduction band, $E_V$ is the valence band and $E_F$ is the Fermi energy level. D represents the difference between the work function for the gate and the work function of the dielectric layer. Thus, when designing the FET (e.g., NMOS transistor, PMOS transistor), the size, shape and materials may be selected to have the lowest possible difference (D) between the gate and the channel.

Having described a CMOS structure that includes a NMOS transistor and a PMOS transistor, a sequencing for fabricating the CMOS structure will now be described below.

Exemplary Sequence for Fabricating a NMOS Transistor or a PMOS Transistor

In some implementations, fabricating a transistor, such as a NMOS transistor or a PMOS transistor, includes several processes. FIG. 8 (which includes FIGS. 8A-8G) illustrates an exemplary sequence for providing or fabricating a transistor. In some implementations, the sequence of FIGS. 8A-8G may be used to provide or fabricate the transistor of FIGS. 3, 4, 5, 6 and/or other transistors described in the present disclosure. It is noted that the sequence for fabricating the transistor may be used to provide or fabricate a CMOS structure having a NMOS transistor and a PMOS transistor. In addition, the sequence for fabricating the transistor may be used to fabricate several transistors (e.g., NMOS transistor, PMOS transistor) at the same time. However, for the purpose of clarity, the sequence of FIG. 8 illustrates the fabrication of one transistor.

It should be noted that the sequence of FIGS. 8A-8G may combine one or more stages in order to simplify and/or clarify the sequence for providing or fabricating a transistor. In some implementations, the order of the processes may be changed or modified. In some implementations, one or more of processes may be replaced or substituted without departing from the spirit of the disclosure.

Figure 8A:
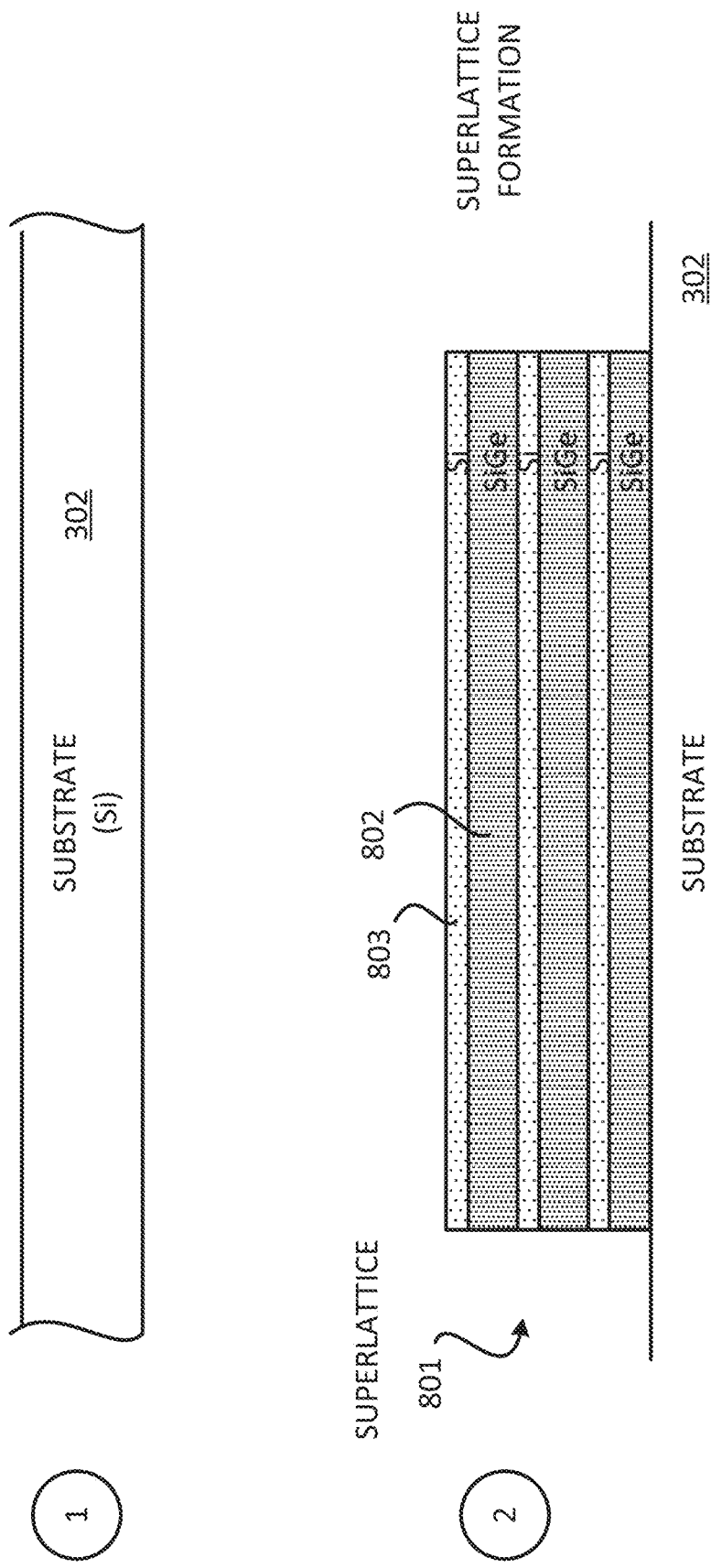
FIG. 8 (comprising FIGS. 8A-8G) illustrates an exemplary sequence for fabricating well-less gate-all-around FETs.

Stage 1, as shown in FIG. 8A, illustrates a state after a substrate 302 is provided. Different implementations may provide different materials for the substrate 302. In some implementations, the substrate 302 may include silicon (Si).

Stage 2 illustrates a state after superlattice formation. In some implementations, superlattice formation includes forming a stacked structure of alternating layers of silicon (Si) (e.g., Si layer 803) and silicon-germanium (SiGe) (e.g., SiGe layer 802) over the substrate 302 and creating one or more superlattice 801 from the stacked structure by removing (e.g., etching, dry etching, wet etching) portions of the stacked structure. The process of forming a stacked structure may include using an epitaxial process. The process of fabricating superlattices may include fabricating one or more shallow trench isolation (STI) (which are not shown). The superlattice formation may also include a fin reveal process where portions of the STI are removed, exposing at least some portions of the superlattice and/or fin.

Figure 8B:
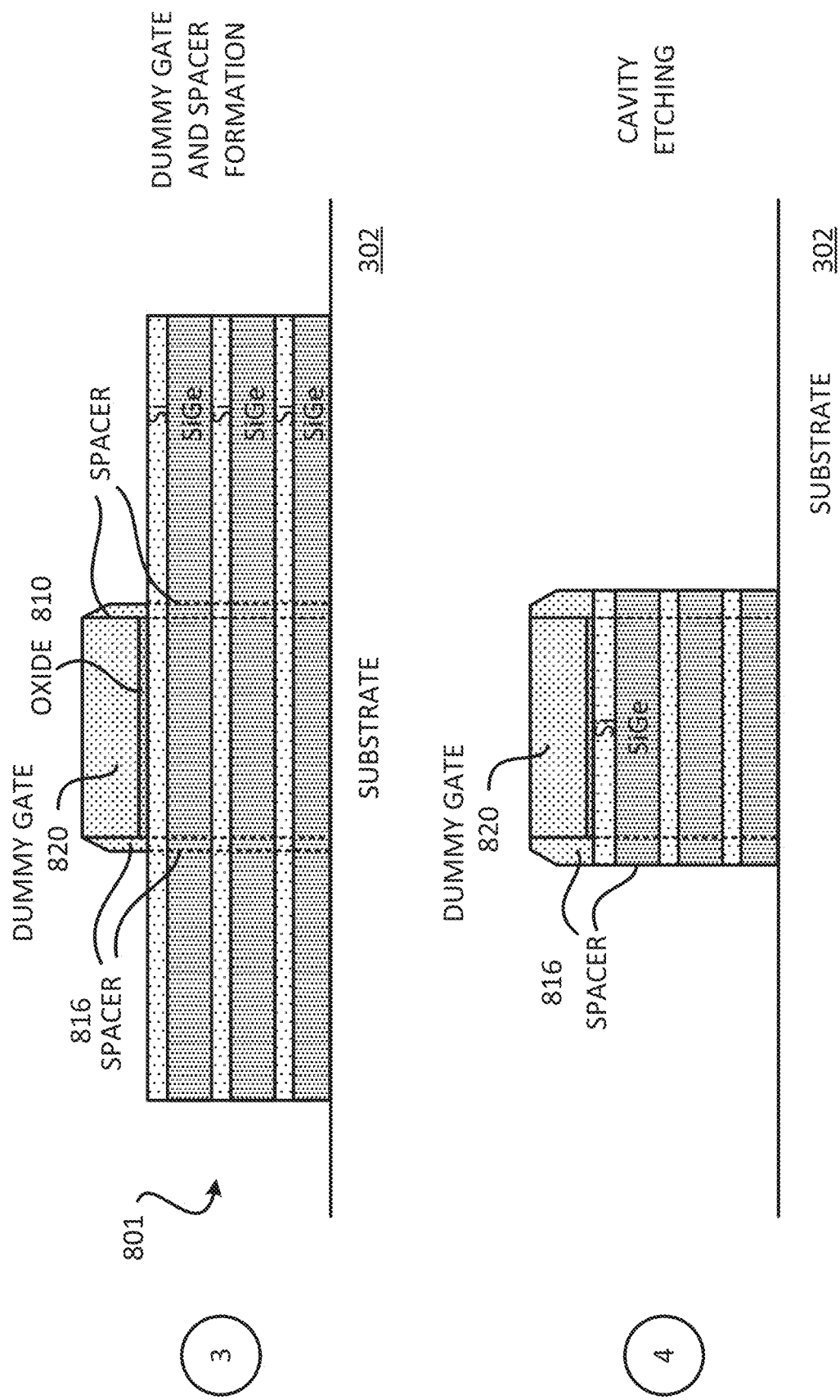

Stage 3, as shown in FIG. 8B, illustrates a state after dummy gate and spacer formation. An oxide layer 810 is formed over the superlattice 801 (e.g., over a top Si layer) and a dummy gate 820 is formed over the oxide layer 810 and the superlattice 801. In addition, spacers 816 are formed over the superlattice 801. More specifically, spacers 816 are formed over the superlattice 801 and next to (and on each side of) the dummy gate 820. It is noted that the spacers 816 are exemplary. The spacers 816 may include an outer spacer. In some implementations, the spacers 816 include the spacer 516, the spacer 616, or any of the spacers described in the disclosure. A chemical vapor deposition (CVD) process and/or an atomic layer deposition (ALD) process may be used to form the dummy gate and/or the spacer.

Stage 4 illustrates a state after cavity etching. After cavity etching, portions of the superlattice 801 not covered by the dummy gate 820 and/or the spacers 816 are removed. Cavity etching involves removing portions of the Si layer (e.g., 803) and SiGe layer (e.g., 802) of the superlattice 801.

Figure 8C:
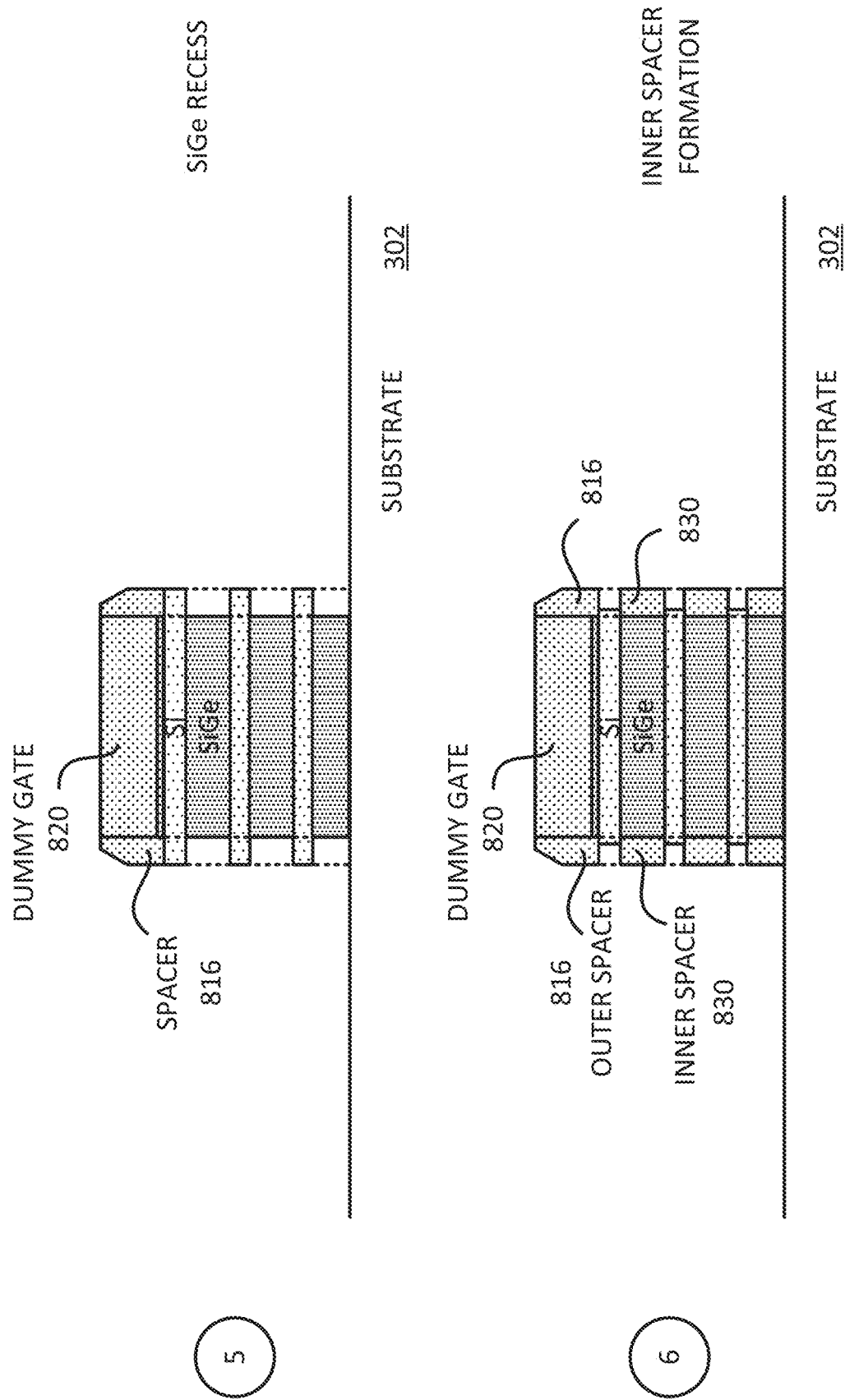

Stage 5, as shown in FIG. 8C, illustrates a state after SiGe recess. After SiGe recess, portions of the SiGe layers (e.g., 802) underneath the spacers 816 are removed.

Stage 6 illustrates a state after inner spacer formation. After inner spacer formation, inner spacers 830 are formed in the cavity where the SiGe was previously removed (as shown in Stage 5).

Figure 8D:
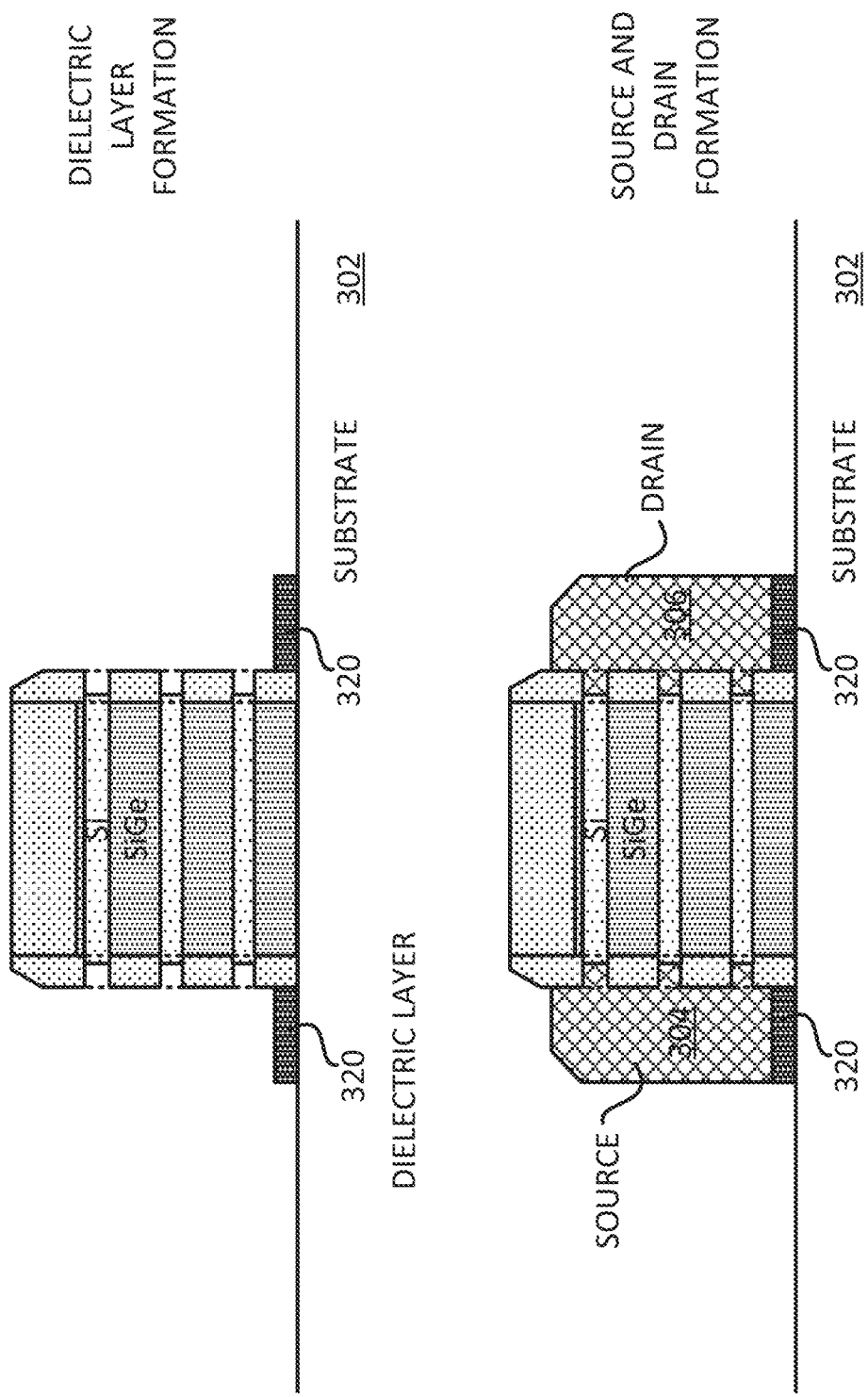

Stage 7, as shown in FIG. 8D, illustrates a state after dielectric layer formation. As shown in stage 7, a dielectric layer 320 is disposed (e.g., formed) over the substrate 302. A deposition process may be used to form the dielectric layer 320.

Stage 8 illustrates a state after source and drain formation. After source and drain formation, a source and a drain are formed over the dielectric layer 320. For example, a first source 304 and a first drain 306 are disposed over the dielectric layer 320.

Figure 8E:
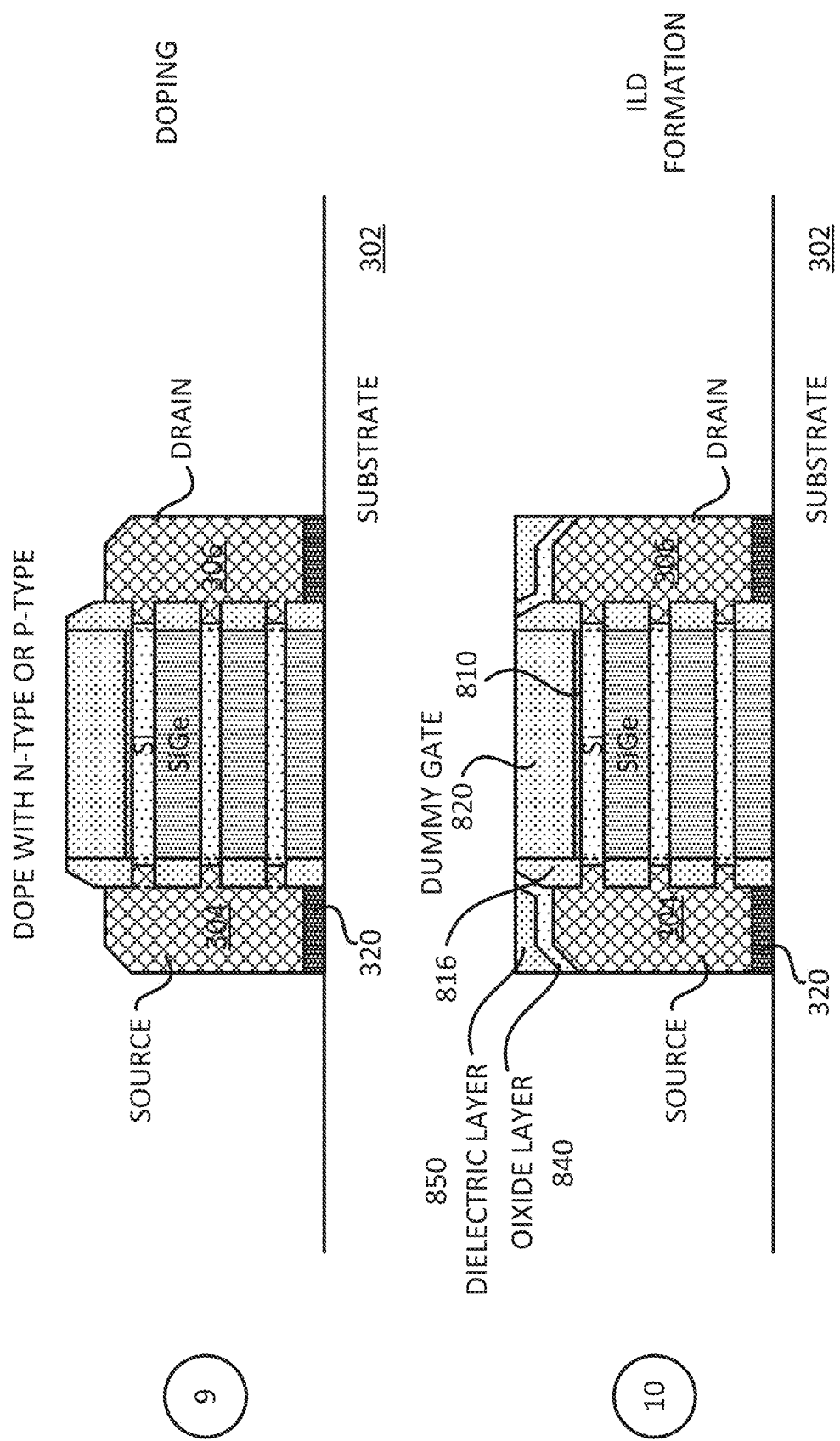

Stage 9, as shown in FIG. 8E, illustrates a state after doping of the source and drain. The source 304 and the drain 306 may be doped with either a N type dopant (N+) or a P type dopant (P+). Doping the source 304 and the drain 306 with a N type dopant (N+) may produce the source 504 and the drain 506. Doping the source 304 and the drain 306 with a P type dopant (P+) may produce the source 604 and the drain 606. Vapor phase epitaxy may be used to dope the source and the drain. However, different implementations may use different processes for doping the source and the drain.

Stage 10 illustrates a state after interlevel dielectric (ILD) formation. After ILD formation, an oxide layer 840 is formed over the source 304, the drain 306 and the spacers 816. A dielectric layer 850 is further formed over the oxide layer 840. A deposition process may be used to form the oxide layer 840 and/or the dielectric layer 850.

Stage 11, as shown in FIG. 8F, illustrates a state after dummy gate and dummy dielectric layer removal, where the dummy gate 820 and the oxide layer 810 are removed, exposing portions of the top Si layer (e.g., 803).

Stage 12 illustrates a state after SiGe removal, where the SiGe layers (e.g., 802) of the superlattice 801 are removed (e.g., etched), leaving cavities between the Si layers (e.g., 803) and/or the Si layer and the substrate 302.

Figure 8G:
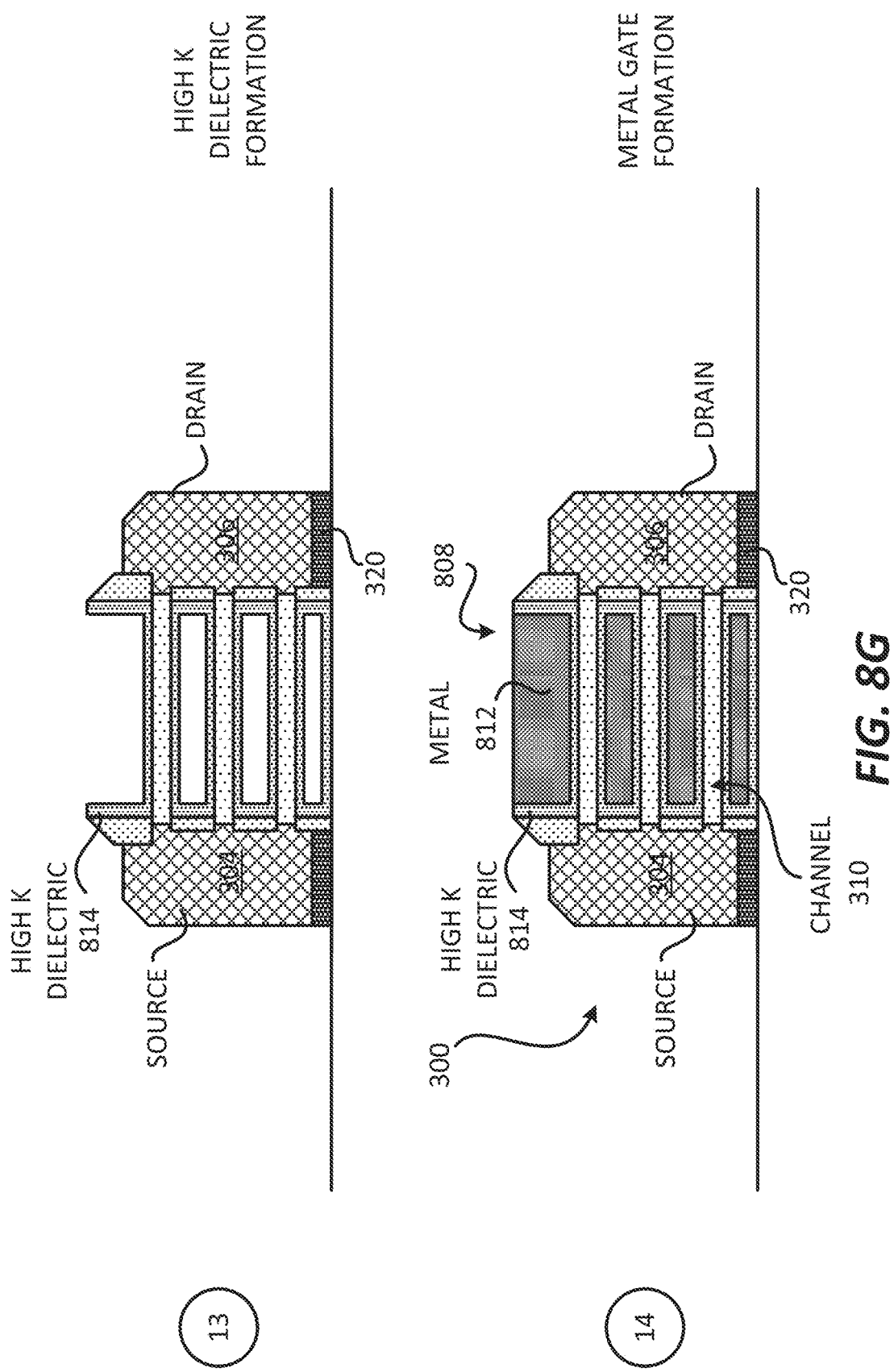

Stage 13, as shown in FIG. 8G, illustrates a state after high K dielectric layer formation, where the high K dielectric layer 814 is formed between the spacers 816 in the cavity that was previously occupied by the SiGe layer. The high K dielectric layer 814 may be the high K dielectric layer 514 or 614. For purpose of clarity, the oxide layer 840 and the dielectric layer 850 are not shown.

Stage 14 illustrates after metal gate formation. After metal gate formation, a metal component 812 is formed between the high K dielectric layer 814. The metal component 812 may be located within the cavity previously occupied by the SiGe layer. The metal component 812 may define the gate 308, the gate 508 or the gate 608. For purpose of clarity, the oxide layer 840 and the dielectric layer 850 are not shown. It is noted that the high K dielectric layer (e.g., 814) may be considered part of the gate (e.g., 308, 508, 608). Thus, in some implementations, the gate (e.g., 308, 508, 608) may include the metal component 812 and the high K dielectric layer (e.g., 814). Stage 14 may illustrate the transistor 300, and depending on the doping of the source and the drain, the NMOS transistor 500 or the PMOS transistor 600. In some implementations, additional processes may be performed on the transistor, including a polishing process.

Figure 9:
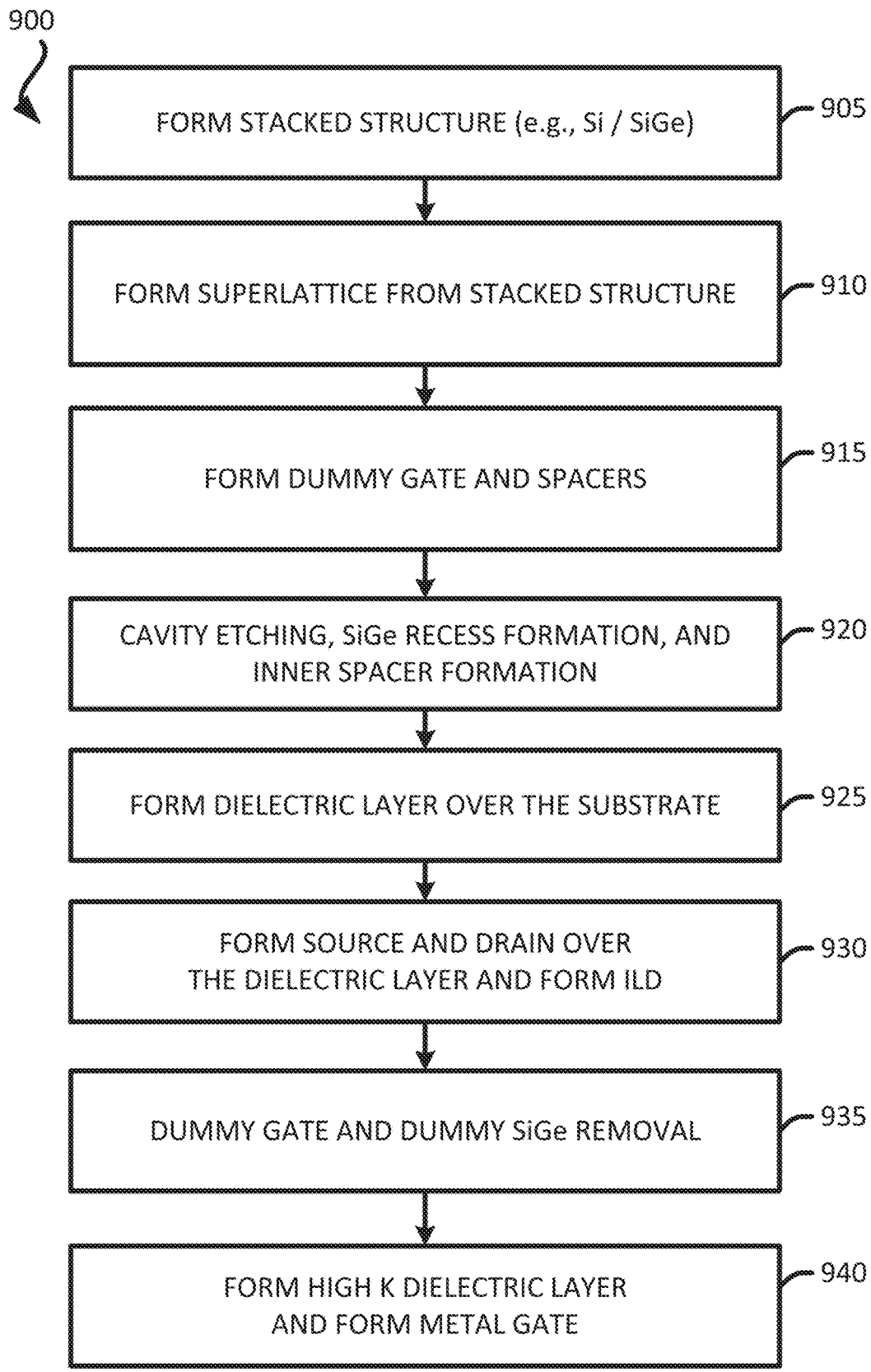
FIG. 9 illustrates an exemplary flow diagram of a method for fabricating well-less gate-all-around FETs.

Exemplary Flow Diagram of a Method for Fabricating a NMOS Transistor and a PMOS Transistor In some implementations, fabricating a transistor includes several processes. FIG. 9 illustrates an exemplary flow diagram of a method 900 for providing or fabricating a transistor (e.g., NMOS transistor a PMOS transistor) The transistor may be part of transistors that form a CMOS structure. In some implementations, the method 900 of FIG. 9 may be used to provide or fabricate the transistor of FIG. 3, 4, 5, 6 and/or other transistors described in the present disclosure.

It should be noted that the sequence of FIG. 9 may combine one or more processes in order to simplify and/or clarify the method for providing or fabricating a transistor. In some implementations, the order of the processes may be changed or modified.

The method forms (at 905) a stacked structure of alternating layers of silicon and silicon-germanium (SiGe) are formed over the substrate 302. The stacked structure may be formed over a substrate 302. Different implementations may provide different materials for the substrate 302. In some implementations, the substrate 302 may include silicon (Si).

The method forms (at 910) superlattices (e.g., 801) from the stacked structure. The superlattices may be formed by removing (e.g., etching) portions of the stacked structure. The process of forming the superlattice may include forming a shallow trench isolation (STI) around the superlattice, and exposing the superlattice by removing portions of the STI. In some implementations, forming the superlattice includes forming the stacked structure as described at 905.

The method forms (at 915) a dummy gate and a spacer, where an oxide layer 810 is formed over the superlattice 801 (e.g., over a top Si layer) and a dummy gate 820 is formed over the oxide layer 810 and the superlattice 801. In addition, spacers 816 are formed over the superlattice 801. More specifically, spacers 816 are formed over the superlattice 801 and next to (and on each side of) the dummy gate 820. It is noted that the spacers 816 are exemplary. In some implementations, the spacers 816 may include the spacer 516, the spacer 616, or any of the spacers described in the disclosure. Stage 3 of FIG. 8B illustrates an example of forming a dummy gate, a spacer and an oxide layer.

The method performs (at 920) cavity etching, SiGe recess formation and inner spacer formation. During cavity etching, portions of the superlattice 801 not covered by the dummy gate 820 and/or the spacers 816 are removed. Cavity etching involves removing portions of the Si and SiGe of the superlattice 801. During SiGe recess formation, portions of the SiGe layer underneath the spacers 816 are removed. During inner spacer formation, inner spacers 830 are formed in the cavity where the SiGe was previously removed. Stages 4-6 of FIGS. 8B-8C illustrates an example of cavity formation, SiGe recess formation and inner spacer formation.

The method forms (at 925) a dielectric layer 320 over the substrate 302. The dielectric layer 320 is disposed over the substrate 302. Different implementations may use different material for the dielectric layer 320. Stage 7 of FIG. 8D illustrates an example of dielectric formation.

The method forms (at 930) a source and drain, and performs inter level dielectric (ILD) formation. Forming the source and the drain may include disposing a source 304 and a drain 306 over the dielectric layer 320. Forming the source and the drain may also include doping the source and the drain. For example, the source 304 and the drain 306 may be doped with either an N type dopant (N+) or a P type dopant (P+). Doping the source 304 and the drain 306 with a N type dopant (N+) may produce the source 504 and the drain 506. Doping the source 304 and the drain 306 with a P type dopant (P+) may produce the source 604 and the drain 606. ILD formation may include forming an oxide layer 840 over the source 304, the drain 306 and the spacers 816. ILD formation may also include forming a dielectric layer 850 over the oxide layer 840. Stages 8-10 of FIGS. 8D and 8E illustrate examples of source and drain formation, doping and ILD formation.

The method performs (at 935) dummy gate removal, where the dummy gate 820 and the oxide layer 810 are removed, exposing portions of the top Si layer (e.g., 803). In addition, the method may also perform dummy SiGe removal, where the SiGe layers (e.g., 802) of the superlattice 801 are removed, leaving cavities between the Si layers and/or the Si layer and the substrate 302. One or more etching processes may be used to remove the dummy gate and the SiGe layer(s). Stages 11-12 of FIG. 8F illustrate an example of dummy gate and SiGe removal.

The method performs (at 940) high K dielectric layer formation and gate formation. During high K dielectric layer formation, the high K dielectric layer 814 is formed between the spacers 816 in the cavity that was previously occupied by the SiGe layer. The high K dielectric layer 814 may be the high K dielectric layer 514 or 614. During gate formation, a metal component 812 is formed between the high K dielectric layer 814. The metal component 812 may be located within the cavity previously occupied by the SiGe layer. The metal component 812 may define the gate 308, the gate 508 or the gate 608. Stages 13 and 14 of FIG. 8G illustrate an example of high K dielectric layer formation and gate formation.

Figure 10:
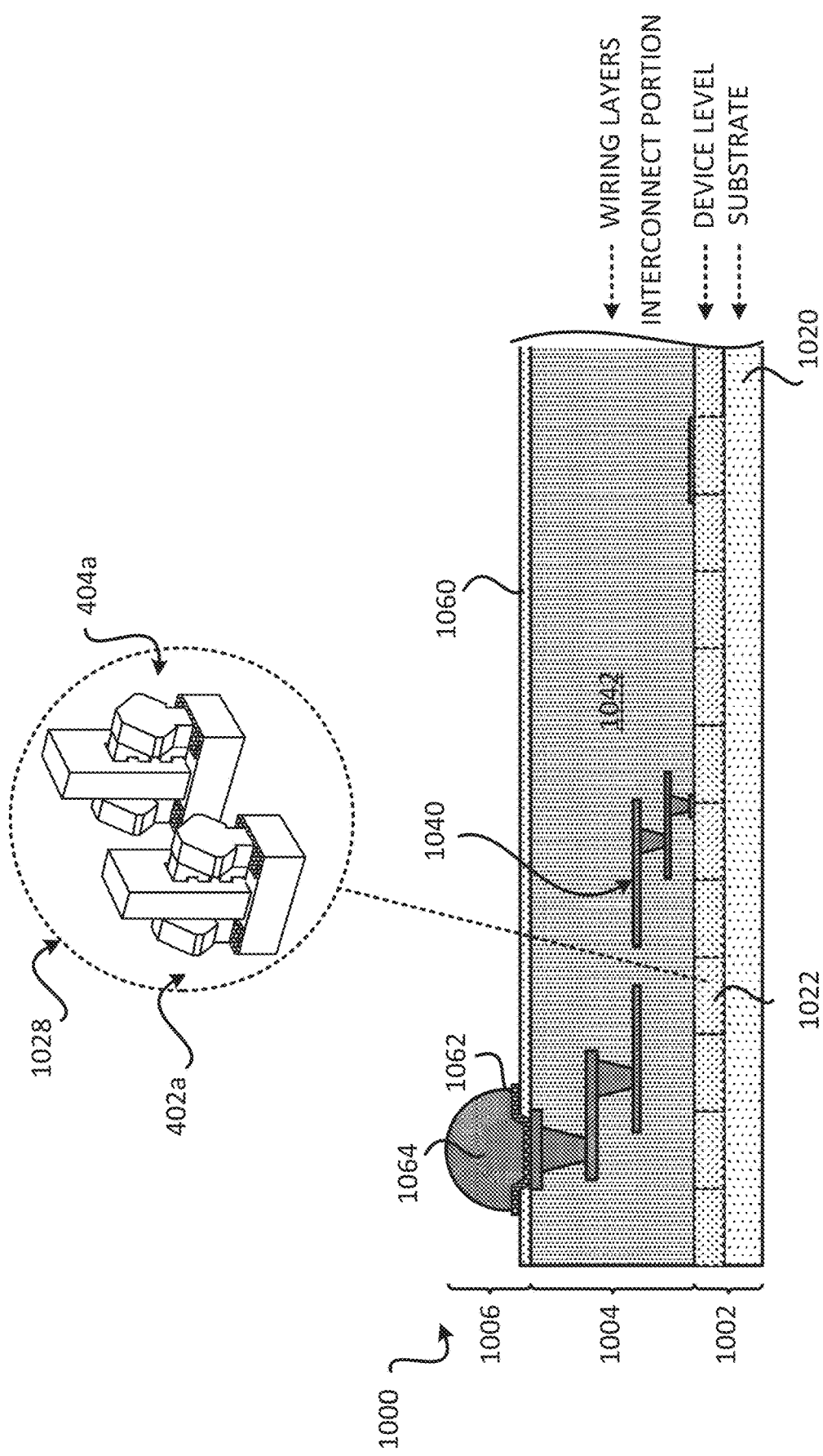
FIG. 10 illustrates a profile view of an integrated device that includes gate-all-around FETs.

Exemplary Integrated Device Comprising a CMOS Structure Having a NMOS Transistor and a PMOS Transistor FIG. 10 illustrates a profile view of an integrated device 1000 that includes at least one CMOS structure having a NMOS transistor and a PMOS transistor. The integrated device 1000 includes a substrate 1020, a plurality of device level cells 1022 (e.g., logic cells), interconnect portion 1004, and a packaging portion 1006. The plurality of device level cells 1022 is formed over the substrate 1020. The plurality of device level cells 1022 may form the device level layer of the integrated device 1000. In some implementations, the plurality of device level cells 1022 may include portions of the substrate 1020. In some implementations, the substrate 1020, the device level layer and the plurality of device level cells 1022 may be referred as the substrate portion 1002 of the integrated device 1000.

The plurality of device level cells 1022 may include a CMOS structure, a NMOS transistor, and/or a PMOS transistor. The plurality of device level cells 1022 may include the cell 400 as described in FIG. 4. As shown in FIG. 10, one of the device level cells includes a CMOS structure 1028 that includes the NMOS transistor 402a and the PMOS transistor 404a. Different implementations may have different numbers and/or arrangements of CMOS structures, NMOS transistors and/or PMOS transistors. The CMOS structure 1028 may be the CMOS structure 401a. In some implementations, the CMOS structure 1028 may be the CMOS structure 401b, which includes the NMOS transistor 402b and the PMOS transistor 404b (which share a gate). The NMOS transistor 402a may be the NMOS transistor 500. The PMOS transistor 404a may be the PMOS transistor 600. The NMOS transistor 402a and/or the PMOS transistor 404a may be well-less transistors.

The interconnect portion 1004 is formed over the substrate portion 1002. In particular, the interconnect portion 1004 is formed over the plurality of device level cells 1022. The interconnect portion 1004 includes wiring layers. The interconnect portion 1004 includes a plurality of interconnects 1040 (e.g., trace, pad, vias) and at least one dielectric layer 1042. The interconnect portion 1004 may provide interconnect between the plurality of CMOS structures, NMOS transistors and/or PMOS transistors.

A packaging portion 1006 is formed over the interconnect portion 1004. The packaging portion 1006 includes a passivation layer 1060, an under bump metallization (UBM) layer 1062 and a solder interconnect 1064. It is noted that the size and shape of the integrated device 1000 is exemplary. Moreover, the components of the integrated device 1000 shown may not be to scale.

Figure 11B:
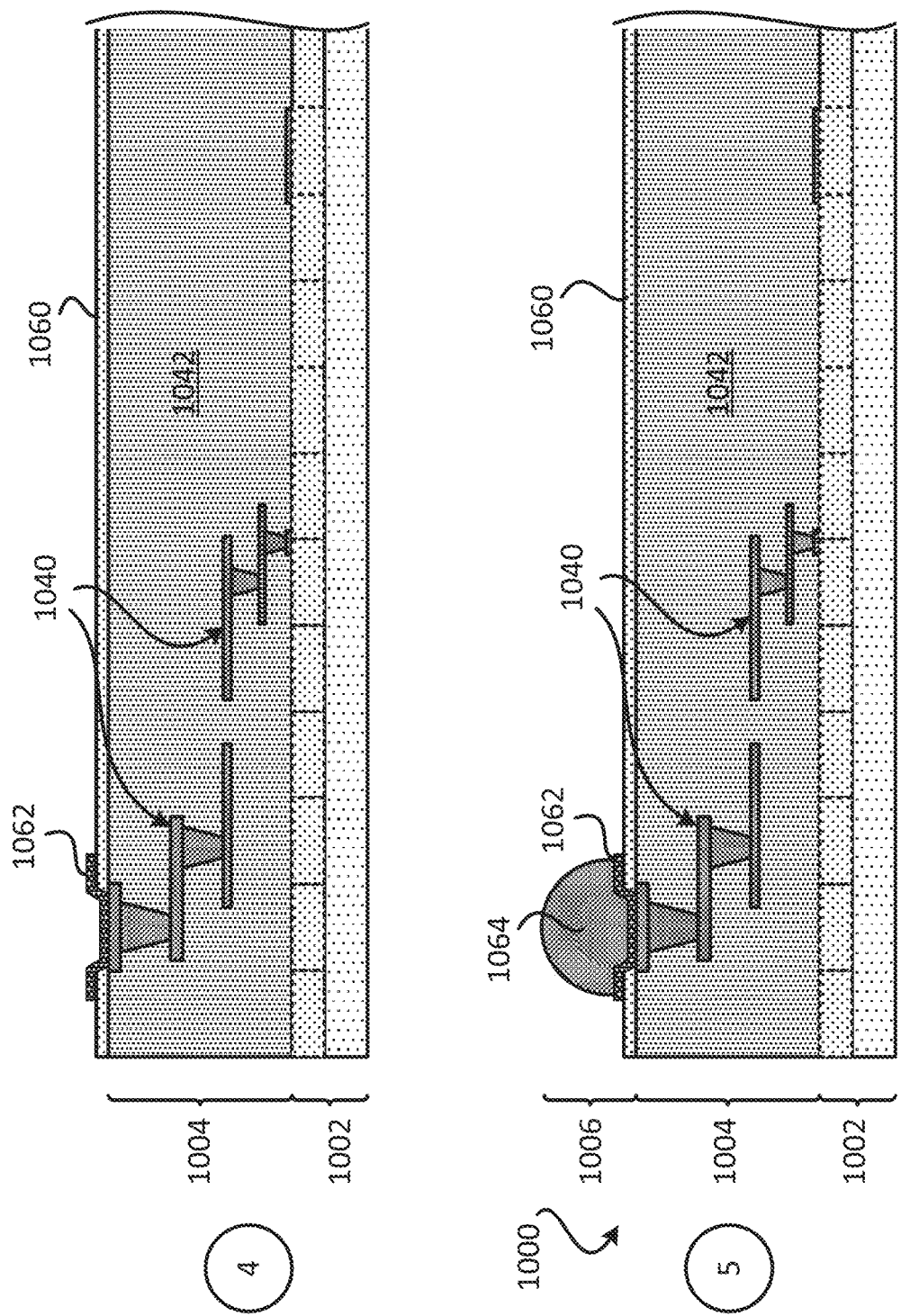
FIG. 11 (comprising FIGS. 11A-11B) illustrates an exemplary sequence for fabricating an integrated device that includes gate-all-around FETs.

Exemplary Sequence for Fabricating an Integrated Device Comprising a CMOS Structure In some implementations, fabricating an integrated device that includes a CMOS structure having a NMOS transistor and a PMOS transistor includes several processes. FIG. 11 (which includes FIGS. 11A-11B) illustrates an exemplary sequence for providing or fabricating an integrated device that includes a CMOS structure having a NMOS transistor and a PMOS transistor. In some implementations, the sequence of FIGS. 11A-11B may be used to provide or fabricate the integrated device of FIG. 10 and/or other integrated devices described in the present disclosure.

It should be noted that the sequence of FIGS. 11A-11B may combine one or more stages in order to simplify and/or clarify the sequence for providing or fabricating an integrated device that includes a CMOS structure having a NMOS transistor and a PMOS transistor. In some implementations, the order of the processes may be changed or modified. In some implementations, one or more of processes may be replaced or substituted without departing from the spirit of the disclosure.

Stage 1, as shown in FIG. 11A, illustrates a state after a substrate 1020 is provided. Different implementations may provide different materials for the substrate 1020. In some implementations, the substrate 1020 may include silicon (Si).

Stage 2 illustrates a state after the device level layer is formed over the substrate 1020. The device level layer includes the plurality of device level cells 1022 (e.g., 400). Thus, Stage 2 illustrates a state after the plurality of device level cells 1022 is formed over the substrate 1020. In some implementations, a front end of line (FEOL) process may be used to fabricate the device level layer (e.g., plurality of device level cells 1022). One or more of cells from the plurality of device level cells may include a CMOS structure having a NMOS transistor and a PMOS transistor, as described above. FIGS. 8A-8G illustrate a sequence for fabricating a transistor (e.g., NMOS transistor, a PMOS transistor) that is part of a CMOS structure.

Stage 3 illustrates a state after the interconnect portion 1004 is formed. The interconnect portion 1004 may include plurality of interconnects 1040 and at least one dielectric layer 1042. In some implementations, a back end of line (BEOL) process may be used to fabricate interconnect portion 1004. The interconnect portion 1004 may be configured to electrically couple one or more CMOS structures having a NMOS transistor and a PMOS transistor.

Stage 4, as shown in FIG. 11B, illustrates a state after a passivation layer 1060 and the under bump metallization (UBM) layer 1062 are formed over the interconnect portion 1004.

Stage 5 illustrates a state after a solder interconnect is coupled to the under bump metallization (UBM) layer 1062. Stage 5 may illustrate the integrated device 1000 that includes a CMOS structure 1028 comprising the NMOS transistor 402a and the PMOS transistor 404a.

Figure 12:
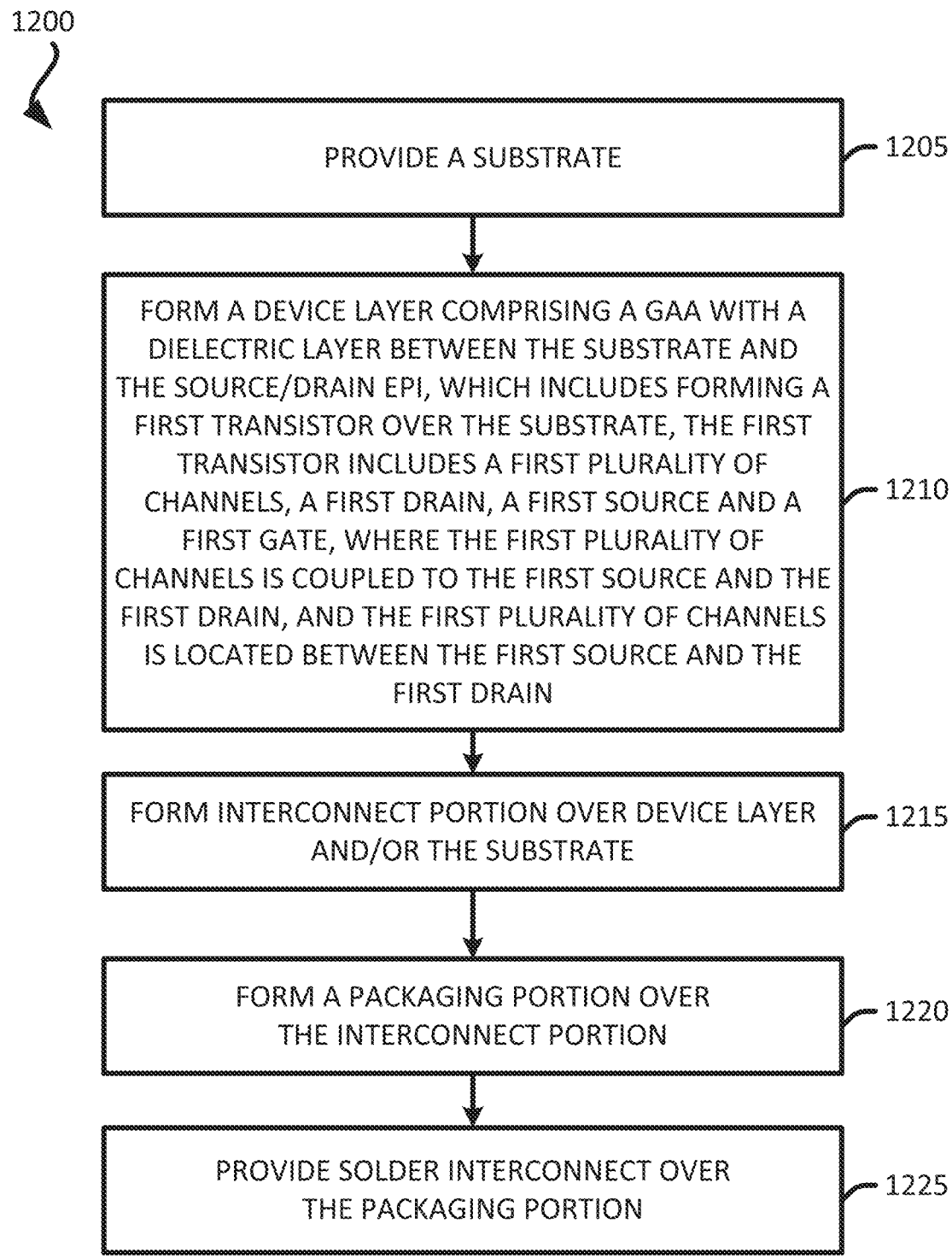
FIG. 12 illustrates an exemplary flow diagram of a method for fabricating an integrated device that includes gate-all-around FETs.

Exemplary Flow Diagram of a Method for Fabricating an Integrated Device Comprising a CMOS Structure In some implementations, providing an integrated device that includes a CMOS structure having a NMOS transistor and a PMOS transistor includes several processes. FIG. 12 illustrates an exemplary flow diagram of a method 1200 for providing or fabricating an integrated device that includes a CMOS structure having a NMOS transistor and a PMOS transistor. In some implementations, the method 1200 of FIG. 12 may be used to provide or fabricate the integrated device of FIG. 10 and/or other integrated devices described in the present disclosure.

It should be noted that the sequence of FIG. 12 may combine one or more processes in order to simplify and/or clarify the method for providing or fabricating an integrated device that includes a CMOS structure having a NMOS transistor and a PMOS transistor. In some implementations, the order of the processes may be changed or modified.

The method provides (at 1205) a substrate (e.g., 1020). Different implementations may provide different materials for the substrate. In some implementations, the substrate may include silicon (Si). The method forms (at 1210) a device level layer (e.g., the plurality of device level cells 1022) over the substrate. In some implementations, a front end of line (FEOL) process may be used to fabricate the device level layer (e.g., plurality of device level cells 1022).

The device level layer may include a plurality of device level cells (e.g., 400). The device level cells may include one or more active devices (e.g., 1200). One or more device level cells may include a CMOS structure having a NMOS transistor and a PMOS transistor, as described in the disclosure. Forming the device level layer may include forming one or more NMOS transistors (e.g., 402a, 402b, 500) and/or one or more PMOS transistors (e.g., 404a, 404b, 600), where there is a dielectric layer between (i) the source and the substrate, and (ii) the drain and the substrate. As mentioned above the NMOS transistors and/or the PMOS transistors may be gate all around (GAA) transistors.

The method may form (at 1210) a first transistor over the substrate. Forming the first transistor includes forming a first plurality of channels over the substrate, forming a dielectric layer over the substrate, forming a first source over the dielectric layer, forming a first drain over the dielectric layer, and forming a first gate around the first plurality of channels. The first plurality of channels is coupled to the first source and the first drain. The first plurality of channels is located between the first source and the first drain.

The method may form (at 1210) a second transistor over the substrate. Forming the second transistor includes forming a second plurality of channels over the substrate, forming the dielectric layer over the substrate, forming a second source over the dielectric layer, forming a second drain over the dielectric layer, and forming a second gate around the second plurality of channels. The second plurality of channels is coupled to the second source and the second drain. The second plurality of channels is located between the second source and the second drain.

The method forms (at 1215) an interconnect portion 1004 over the device level layer (e.g., plurality of device level cells 1022) and/or the substrate 1020. The interconnect portion 1004 may include a plurality of interconnect 1040 and at least one dielectric layer 1042. In some implementations, a back end of line (BEOL) process may be used to form the interconnect portion 1904. The interconnect portion 1004 may be configured to electrically couple one or more transistors, and/or one or more CMOS structures having a NMOS transistor and a PMOS transistor.

The method forms (at 1220) a packaging portion 1006 over the interconnect portion 1904. The packaging portion 1006 may include the passivation layer 1060 and the under bump metallization (UBM) layer 1062. The passivation layer 1060 and the under bump metallization (UBM) layer 1062 are formed over the interconnect portion 1004.

The method provides (at 1225) a solder interconnect 1064. In some implementations, the solder interconnect 1064 is coupled to the under bump metallization (UBM) layer 1062

It is also noted that the method 1200 of FIG. 12 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs).

Exemplary Electronic Devices

Figure 13:
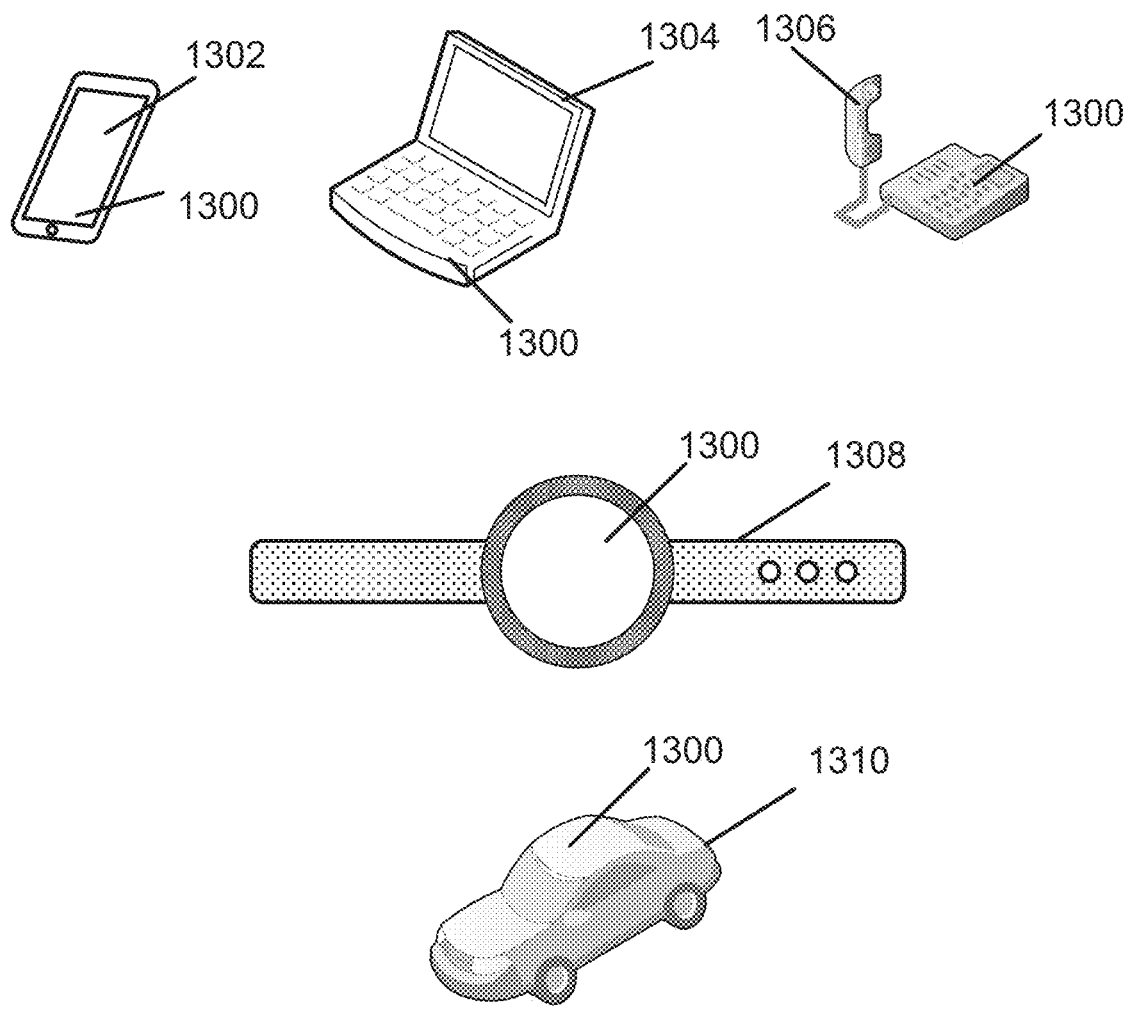
FIG. 13 illustrates various electronic devices that may integrate a die, an integrated device, an integrated passive device (IPD), a device package, a package, an integrated circuit and/or PCB described herein.

FIG. 13 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1302, a laptop computer device 1304, a fixed location terminal device 1306, a wearable device 1308, or automotive vehicle 1310 may include a device 1300 as described herein. The device 1300 may be, for example, any of the devices and/or integrated circuit (IC) packages described herein. The devices 1302, 1304, 1306 and 1308 and the vehicle 1310 illustrated in FIG. 13 are merely exemplary. Other electronic devices may also feature the device 1300 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3-7, 8A-8G, 9-10, 11A-11B and/or 12-13 may be rearranged and/or combined into a single component, process, feature or function or embodied in several components, processes, or functions. Additional elements, components, processes, and/or functions may also be added without departing from the disclosure. It should also be noted FIGS. 3-7, 8A-8G, 9-10, 11A-11B and/or 12-13 and its corresponding description in the present disclosure is not limited to dies and/or ICs. In some implementations, FIGS. 3-7, 8A-8G, 9-10, 11A-11B and/or 12-13 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term etching may include dry etching or wet etching, and may involve the use of a mask. Forming or disposing a metal may include a plating process, a chemical vapor deposition (CVP) process, and/or an atomic layer deposition (ALD) process. In some implementations, forming one or more dielectric layers, Si layers and/or SiGe layers may include one or more deposition processes. When a transistor is free of a well, it may mean that a portion of the substrate that is underneath the source, drain, and/or channels of the transistor does not include a well (P well, N well). It is noted that wells are optional. It is also noted that transistors that include a dielectric layer (used for isolation) may still include one or more wells in the substrate.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:
1. An integrated device comprising:
a substrate; and
a first transistor formed over the substrate, the first transistor comprising:
   a dielectric layer disposed over the substrate;
   a first source disposed over the dielectric layer;
   a first drain disposed over the dielectric layer;
   a first plurality of channels coupled to the first source and the first drain, the first plurality of channels located between the first source and the first drain; and
   a first gate surrounding the first plurality of channels,
   a high K dielectric layer coupled to the first gate,
     wherein the high K dielectric layer is a different material than the dielectric layer, and wherein a portion of the high K dielectric layer (i) is touching the substrate and (ii) is located laterally to the dielectric layer.

2. The integrated device of claim 1, wherein the first transistor is free of a well.

3. The integrated device of claim 1, wherein the dielectric layer is an isolation dielectric layer that is configured to isolate the first source and the first drain from the substrate.

4. The integrated device of claim 1, wherein the dielectric layer has a dielectric thickness in a range of approximately 7-20 nanometers (nm).

5. The integrated device of claim 1, wherein each channel from the first plurality of channels has a channel thickness of approximately 5-10 nanometers (nm).

6. The integrated device of claim 1,
wherein the first plurality of channels includes a first channel coupled to the first source and the first drain, the first channel having a first channel thickness, and
wherein a dielectric thickness of the dielectric layer is equal or less than the first channel thickness of the first channel.

7. The integrated device of claim 1, further comprising a second transistor formed over the substrate, the second transistor comprising:
the dielectric layer disposed over the substrate;
a second source disposed over the dielectric layer;
a second drain disposed over the dielectric layer;
a second plurality of channels coupled to the second source and the second drain, the second plurality of channels located between the second source and the second drain; and
a second gate surrounding the second plurality of channels.

8. The integrated device of claim 7, wherein the first gate and the second gate are part of the same gate.

9. The integrated device of claim 7, wherein the first transistor and the second transistor are each free of a well.

10. The integrated device of claim 7,
wherein the first source and the first drain, each includes N type dopant (N+), and
wherein the second source and the second drain, each includes P type dopant (P+).

11. The integrated device of claim 7, wherein the dielectric layer is an isolation dielectric layer that is configured to isolate (i) the first source and the first drain from the substrate, and (ii) the second source and the second drain from the substrate.

12. The integrated device of claim 1, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

13. An apparatus comprising:
a substrate; and
first transistor means formed over the substrate, wherein the first transistor means comprises:
a dielectric layer disposed over the substrate;
first source means disposed over the dielectric layer;
first drain means disposed over the dielectric layer;
first means for channeling coupled to the first source means and the first drain means, the first means for channeling located between the first source means and the first drain means; and
first gate means surrounding the first means for channeling,
a high K dielectric layer coupled to the first gate means, wherein the high K dielectric layer is a different material than the dielectric layer, and
wherein a portion of the high K dielectric layer (i) is touching the substrate and (ii) is located laterally to the dielectric layer.

14. The apparatus of claim 13, wherein the first transistor means is free of a well.

15. The apparatus of claim 13, wherein the dielectric layer is an isolation dielectric layer that is configured to isolate the first source means and the first drain means from the substrate.

16. The apparatus of claim 13, wherein the dielectric layer has a dielectric thickness in a range of approximately 7-20 nanometers (nm).

17. The apparatus of claim 13, further comprising a second transistor means formed over the substrate, the second transistor means comprising:
the dielectric layer disposed over the substrate;
second source means disposed over the dielectric layer;
second drain means disposed over the dielectric layer;
second means for channeling coupled to the second source means and the second drain means, the second means for channeling located between the second source means and the second drain means; and
second gate means surrounding the second means for channeling.

18. The apparatus of claim 17, wherein the second transistor means is configured to be electrically coupled to the first transistor means to form a complementary metal-oxide-semiconductor (CMOS) structure.

19. The apparatus of claim 17, wherein the first transistor means and the second transistor means are each free of a well.

20. The apparatus of claim 17,
wherein the first source means and the first drain means, each includes N type dopant (N+), and
wherein the second source means and the second drain means, each includes P type dopant (P+).

21. The apparatus of claim 17, wherein the dielectric layer is an isolation dielectric layer that is configured to isolate (i) the first source means and the first drain means from the substrate, and (ii) the second source means and the second drain means from the substrate.

22. The apparatus of claim 13, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

23. A method for fabricating an integrated device, comprising:
providing a substrate; and
forming a first transistor over the substrate, wherein forming the first transistor comprises:
forming a first plurality of channels over the substrate;
forming a dielectric layer over the substrate;
forming a first source over the dielectric layer;
forming a first drain over the dielectric layer; and
forming a high K dielectric layer that is configured to be coupled to a first gate,
wherein the high K dielectric layer is a different material than the dielectric layer, and wherein a portion of the high K dielectric layer is formed such that the portion of the high K dielectric layer (i) is touching the substrate and (ii) is located laterally to the dielectric layer forming the first gate around the first plurality of channels,
wherein the first plurality of channels is coupled to the first source and the first drain, and
wherein the first plurality of channels is located between the first source and the first drain.

24. The method of claim 23, wherein the first transistor is configured to operate as a N-type channel metal oxide semiconductor transistor (NMOS).

25. The method of claim 23, wherein the first transistor is configured to operate as a P-type channel metal oxide semiconductor transistor (PMOS).

26. The method of claim 23, further comprising forming a second transistor over the substrate, wherein forming the second transistor comprises:
forming a second plurality of channels over the substrate;
forming a second source over the dielectric layer;
forming a second drain over the dielectric layer;
forming a second gate around the second plurality of channels,
wherein the second plurality of channels is coupled to the second source and the second drain, and
wherein the second plurality of channels is located between the second source and the second drain.

* * * * *